(12) United States Patent
Prechtl et al.

(10) Patent No.: US 11,721,754 B2
(45) Date of Patent: Aug. 8, 2023

(54) ENHANCEMENT MODE TRANSISTOR DEVICE

(71) Applicant: Infineon Technologies Austria AG, Villach (AT)

(72) Inventors: Gerhard Prechtl, Rosegg (AT); Gilberto Curatola, Villach (AT); Oliver Haeberlen, St. Magdalen (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/859,575

(22) Filed: Jul. 7, 2022

(65) Prior Publication Data

US 2022/0344501 A1    Oct. 27, 2022

Related U.S. Application Data

(63) Continuation of application No. 16/989,318, filed on Aug. 10, 2020, now Pat. No. 11,417,758.

(30) Foreign Application Priority Data

Aug. 13, 2019 (EP) .................... 19191608

(51) Int. Cl.
*H01L 29/778* (2006.01)
*H01L 29/20* (2006.01)

(52) U.S. Cl.
CPC ...... *H01L 29/7787* (2013.01); *H01L 29/2003* (2013.01)

(58) Field of Classification Search
None
See application file for complete search history.

(56) References Cited

U.S. PATENT DOCUMENTS

| 11,417,758 B2* | 8/2022 | Prechtl ............... H01L 29/0619 |
| 2013/0126885 A1 | 5/2013 | Disney et al. |
| 2015/0179741 A1 | 6/2015 | Umeda et al. |
| 2016/0043643 A1 | 2/2016 | Ujita et al. |
| 2018/0248027 A1 | 8/2018 | Okita et al. |
| 2021/0050439 A1 | 2/2021 | Prechtl et al. |

* cited by examiner

*Primary Examiner* — Jack S Chen
(74) *Attorney, Agent, or Firm* — Murphy, Bilak & Homiller, PLLC

(57) ABSTRACT

An enhancement mode Group III nitride-based transistor device includes a body having a first surface and a Group III nitride barrier layer arranged on a Group III nitride channel layer and forming a heterojunction therebetween. A first cell field includes transistor cells and an edge region. Each transistor cell includes source, gate and drain fingers extending substantially parallel to one another on the first surface in a longitudinal direction. The gate finger, arranged laterally between the source and drain fingers, includes a p-doped Group III nitride finger arranged between a metallic gate finger and the first surface. The edge region surrounds the transistor cells and includes an edge termination structure having an isolation ring and a p-doped Group III nitride runner. The isolation ring locally interrupts the heterojunction. The runner, extending transversely to the longitudinal direction, is located laterally between the isolation ring and an end of the drain finger.

21 Claims, 22 Drawing Sheets

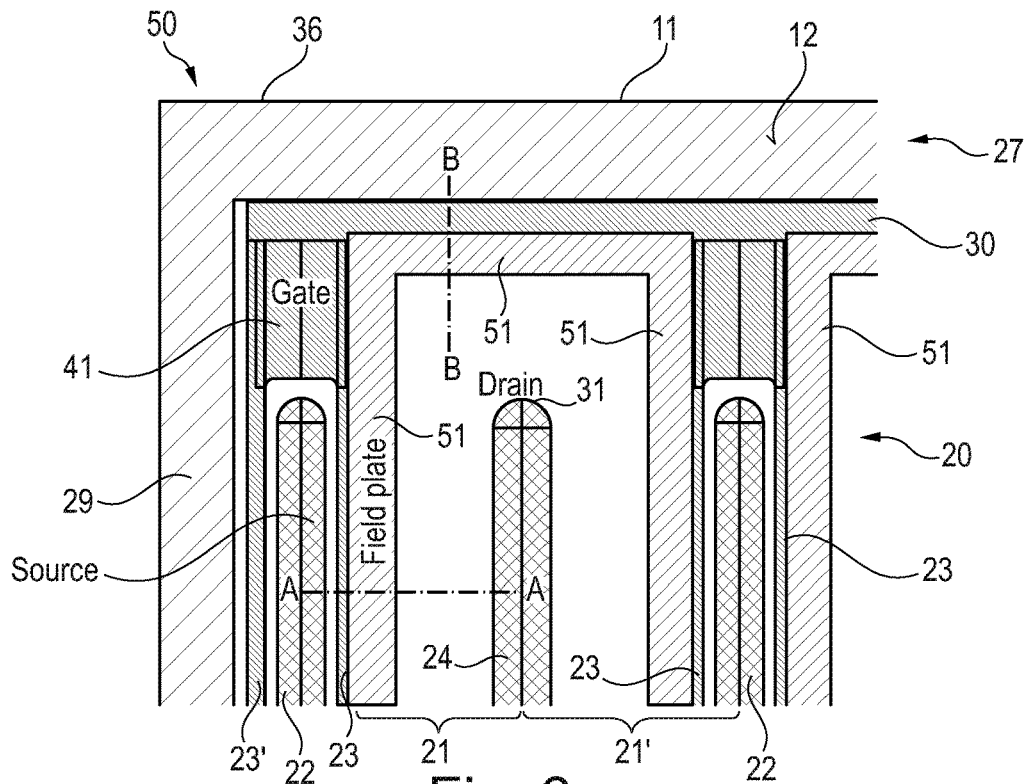
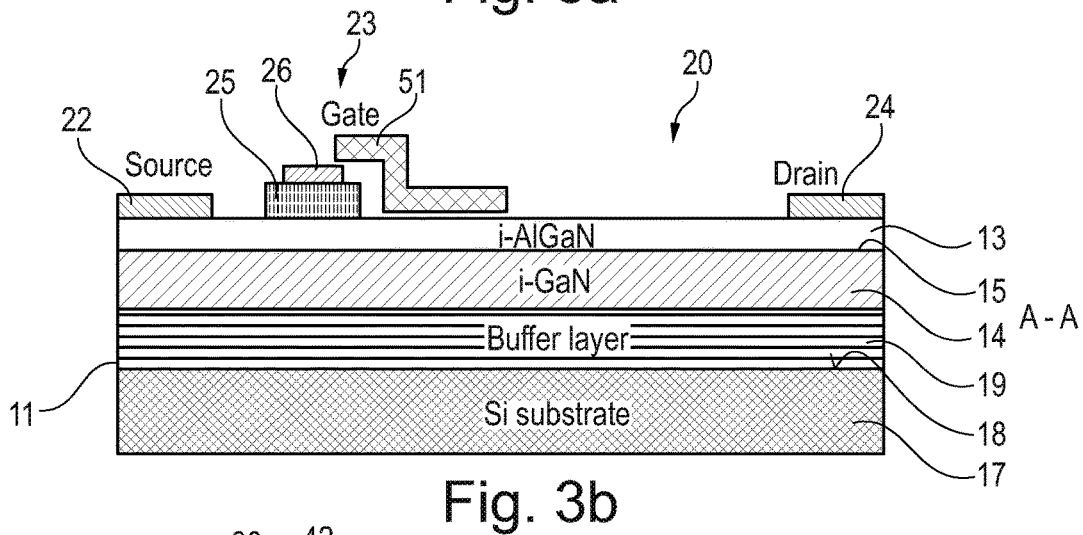
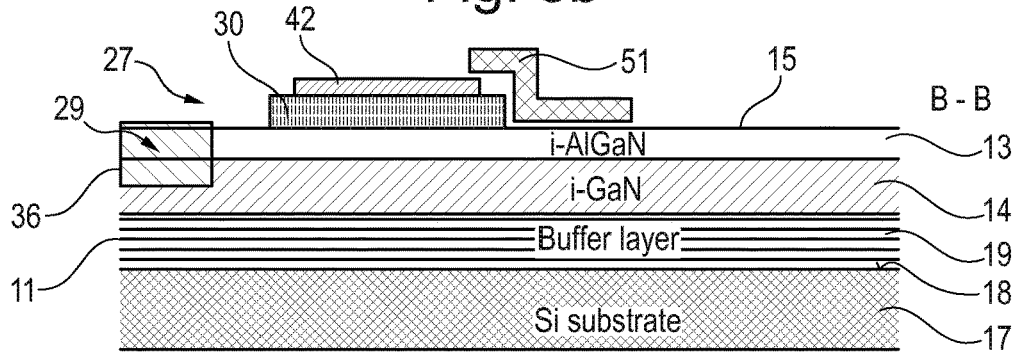
Fig. 3a
Fig. 3b
Fig. 3c

ENHANCEMENT MODE TRANSISTOR DEVICE

BACKGROUND

To date, transistors used in power electronic applications have typically been fabricated with silicon (Si) semiconductor materials. Common transistor devices for power applications include Si CoolMOS®, Si Power MOSFETs, and Si Insulated Gate Bipolar Transistors (IGBTs). More recently, silicon carbide (SiC) power devices have been considered. Group III nitride semiconductor devices, such as gallium nitride (GaN)-based devices, are now emerging as attractive candidates to carry large currents, support high voltages and to provide very low on-resistance and fast switching times.

Transistor devices commonly include an edge termination structure providing electrical isolation between the active device region and the edge region of the device. US 2013/126885 A1 discloses an example of an edge termination structure for a vertical GaN device which includes a guard ring formed by implantation.

Further improvements to Group III nitride-based transistor devices are desirable.

SUMMARY

According to the invention, an enhancement mode Group III nitride-based transistor device is provided that comprises a body comprising a first surface, the body comprising a Group III nitride barrier layer arranged on a Group III nitride channel layer, forming a heterojunction therebetween capable of supporting a two-dimensional carrier (charge) gas, a first cell field comprising plurality of transistor cells and an edge region. Each transistor cell comprises a source finger, a gate finger and drain finger that extend substantially parallel to one another on the first surface and in a longitudinal direction. The gate finger is arranged laterally between the source finger and the drain finger and comprises a p-doped Group III nitride finger arranged between a metallic gate finger and the first surface. The edge region surrounds the plurality of transistor cells and comprises an edge termination structure. The edge termination structure comprises an isolation ring and a p-doped Group III nitride runner. The isolation ring locally interrupts the two-dimensional carrier gas and, optionally, also locally interrupts the heterojunction. The p-doped Group III nitride runner extends transversely to the longitudinal direction and is located laterally between the isolation ring and a first end of the drain finger.

The p-doped Group III nitride runner and the p-doped Group III nitride finger of the gate finger are positioned on the first surface of the body.

In some embodiments, the interface between the p-doped Group III nitride runner and the first surface of the body is planar and the interface between the p-doped Group III nitride finger of the gate finger and the first surface of the body is planar.

In some embodiments, the p-doped Group III nitride runner and the p-doped Group III nitride finger of the gate finger have a recessed structure and comprise T-shape having a central portion that protrudes into a recess formed in the first surface of the body, in particular into a recess formed the Group III nitride-based barrier layer.

In some embodiments, the p-doped Group III nitride runner is electrically coupled to gate potential or to source potential.

In some embodiments, the first end of the drain electrode is spaced apart by a distance $L_{DEdge}$ from the p-doped Group III nitride runner and a distance between the drain finger and the gate finger is $L_{DG}$, wherein $L_{DEedge} \geq L_{DG}$.

In some embodiments, a distance between the source finger and the gate finger is $L_{SG}$ and is smaller than the distance between the drain finger and the gate finger $L_{DG}$ so that $L_{SG} < L_{DG}$ to form an asymmetrical arrangement.

In some embodiments, the distance between the source finger and the gate finger $L_{SG}$ is substantially the same as distance between the drain finger and the gate finger $L_{DG}$, i.e. $L_{SG} \sim L_{DG}$, to form a symmetrical arrangement.

In some embodiments, the metallic gate finger forms a Schottky contact to the p-doped Group III nitride finger. Alternatively, the metallic gate finger may form an ohmic contact to the p-doped Group III nitride finger.

In some embodiments, the p-doped Group III nitride runner further comprises extensions to form a continuous ring that laterally surrounds the first cell field. The extensions comprise p-doped Group III nitride and are positioned on the first surface of the body.

In some embodiments, the p-doped Group III nitride runner extends from and is integral with the p-doped Group III nitride finger of the gate finger.

In some embodiments, the p-doped Group III nitride runner and the p-doped Group III nitride finger of the gate finger together form a continuous ring that laterally surrounds the drain finger.

In some embodiments, the p-doped Group III nitride runner is laterally spaced apart from the isolation ring. The p-doped Group III nitride runner has an outboard edge that is laterally spaced apart from the inboard edge of the isolation ring and an inboard edge that is laterally spaced apart from the first end of the drain finger.

In some embodiments, the inboard edge of the p-doped Group III nitride runner is laterally spaced apart from the first end of the source finger.

In some embodiments, the inboard edge of the p-doped Group III nitride runner is laterally spaced apart from the first end of the gate finger.

In some embodiments, an outboard region of the p-doped Group III nitride runner laterally overlaps with the isolation ring.

In some embodiments, the isolation ring comprises an implantation region having a depth so as to locally interrupt the two-dimensional carrier gas. In some embodiments, the implantation region has a depth from the first surface that is at least as great as the depth of the heterojunction from the first surface so as to locally interrupt the two-dimensional carrier gas.

In some embodiments, the isolation ring comprises a recess comprising insulating material. The recess has a base that is positioned at a depth from the first surface so as to locally interrupt the heterojunction and the two-dimensional carrier gas. In some embodiments, the base of the recess has a depth from the first surface that is at least as great as the depth of the heterojunction from the first surface so as to locally interrupt the two-dimensional carrier gas.

In some embodiments, the isolation ring comprises a recess that remains unfilled. The recess has a base that is positioned at a depth from the first surface so as to locally interrupt the heterojunction and the two-dimensional carrier gas. In some embodiments, the base of the recess has a depth from the first surface that is at least as great as the depth of the heterojunction from the first surface so as to locally interrupt the two-dimensional carrier gas.

In some embodiments in which the isolation ring comprises an unfilled recess, the p-doped Group III nitride layer of the gate finger is positioned on at least a portion of the inboard side face of the recess and optionally on at least a portion of the base of the recess.

In some embodiments, the enhancement mode Group III nitride-based transistor device further comprises a field plate.

In some embodiments, the field plate is located at a drain side of the metallic gate finger and at a drain side of the p-doped Group III nitride runner.

In some embodiments, the field plate has the form of a continuous ring that laterally surrounds and is spaced apart from the drain finger.

In some embodiments, the enhancement mode Group III nitride-based transistor device further comprises a source connected runner that is arranged laterally between the p-doped Group III nitride runner and the isolation ring.

In some embodiments, the enhancement mode Group III nitride-based transistor device further comprises a gate runner. The gate runner may be positioned laterally adjacent one or more sides of the cell field and is electrically coupled to the gate fingers. The gate runner may comprise a power metal layer that is positioned in a different plane to the gate fingers and the p-doped Group III nitride runner.

In some embodiments, the gate runner comprises a p-doped Group III nitride gate runner and a metallic gate runner arranged on the p-doped Group III nitride gate runner.

In some embodiments, the gate runner comprises a p-doped Group III nitride gate runner on the first surface and a metallic gate runner arranged on the p-doped Group III nitride gate runner and further comprises a power metal gate layer that is positioned in a plane above the metallic gate runner and is electrically coupled to the gate fingers by one or more conductive vias that extend between the power metal gate layer and the metallic gate runner and/or the p-doped Group III nitride runner.

In some embodiments, the enhancement mode Group III nitride-based transistor device further comprises a second cell field and a gate runner positioned laterally between the first cell field and the second cell field.

In some embodiments, the gate runner comprises a p-doped Group III nitride gate runner and a metallic gate runner arranged on the p-doped Group III nitride gate runner and the gate runner extends transversely to the longitudinal direction and is positioned laterally adjacent and spaced apart from a second end of drain finger that opposes the first end.

In some embodiments, the p-doped Group III nitride finger of the gate finger extends continuously from the first cell field to the second cell field. In some embodiments, both the p-doped Group III nitride gate finger and metallic gate finger extend continuously from the first cell field to the second cell field.

In some embodiments, gate fingers positioned on opposing lateral sides of a respective source finger are coupled by a gate connection region, the gate connection region comprising a p-doped Group III nitride gate connection region arranged on the first surface and a metallic gate connection region arranged on the Group III nitride gate connection region.

In some embodiments, the enhancement mode Group III nitride-based transistor device further comprises a gate runner, the gate runner comprising a p-doped Group III nitride gate runner arranged on the first surface and a metallic gate runner arranged on the p-doped Group III nitride runner and the gate runner extends transversely to the longitudinal direction and is coupled with the gate fingers. Gate fingers positioned on opposing lateral sides of a respective source finger are coupled by a gate connection region, the gate connection region comprising a p-doped Group III nitride gate connection region arranged on the first surface and a metallic gate connection region arranged on the Group III nitride gate connection region. The gate connection regions are coupled to one another by the gate runner.

In some embodiments, the enhancement mode Group III nitride-based transistor device further comprises a second cell field and the gate connection region extends continuously from the first cell field to the second cell field and at least one gate runner is positioned laterally between the first cell field and the second cell field. A gate contact via extends between the gate connection region and an overlying gate power runner, and/or a gate contact via extends between the p-doped Group III nitride runner and an overlying gate power runner.

In some embodiments, two gate runners are positioned laterally between the first cell field and the second cell field and are spaced apart from one another. A gate contact via may extend between the gate connection region and an overlying gate power runner, and/or a gate contact via may extends between one or both of the p-doped Group III nitride runners and an overlying gate power runner.

In some embodiments, a gate contact is arranged in the distal end portion of the gate finger.

In an embodiment, an enhancement mode Group III nitride-based transistor device comprises a body comprising a first surface, the body comprising a Group III nitride barrier layer arranged on a Group III nitride channel layer and forming a heterojunction therebetween capable of supporting a two-dimensional carrier gas, a first cell field comprising plurality of transistor cells, each transistor cell comprising a source finger, a gate finger and drain finger that extend substantially parallel to one another on the first surface and in a longitudinal direction, the gate finger being arranged laterally between the source finger and the drain finger and comprising a p-doped Group III nitride finger arranged between a metallic gate finger and the first surface and an edge region surrounding the plurality of transistor cells and comprising an edge termination structure, wherein the edge termination structure comprises an isolation ring that locally interrupts the heterojunction and/or the two-dimensional carrier gas. Each source finger is laterally surrounded by a closed ring of p-doped Group III nitride material, the closed ring being laterally spaced apart from the source finger and from the isolation ring, wherein the closed ring is formed from the gate fingers positioned on opposing lateral sides of the respective source finger and p-doped Group III nitride gate connection regions that are positioned laterally adjacent and spaced apart from opposing distal ends of the source finger and that extend between the two gate fingers.

In this embodiment, the p-doped Group III nitride material is not positioned laterally between the first end of the drain finger and the isolation ring. The isolation ring may be formed of a damaged region having a continuous ring form.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIGS. 3a to 3c illustrate a plan view and cross-sectional views along the line A-A and the line B-B of FIG. 3a, respectively, of an enhancement mode Group III nitride-based transistor device including a field plate according to an embodiment.

DETAILED DESCRIPTION

Figure 1A:
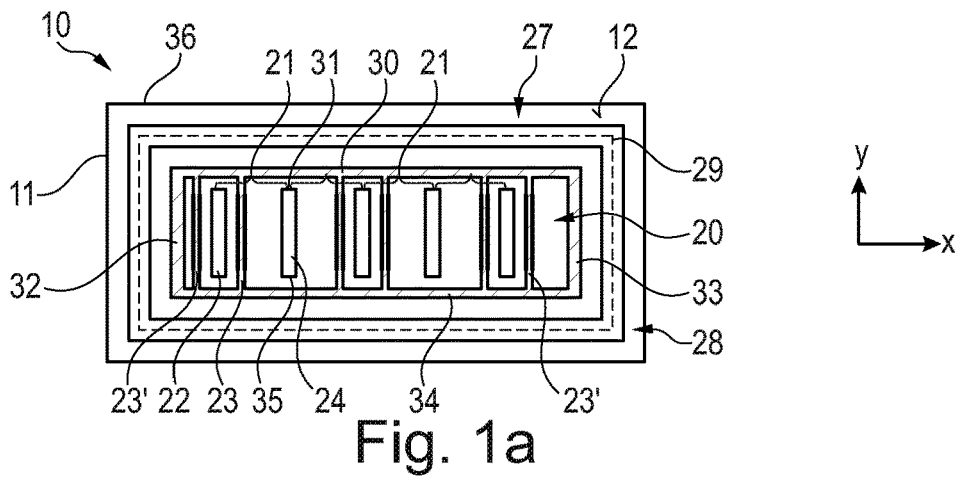
FIGS. 1a to 1d illustrate a plan view, an enlarged plan view and cross-sectional views along the line A-A and the line B-B of FIG. 1b, respectively, of an enhancement mode Group III nitride-based transistor device according to an embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

An enhancement-mode device, such as an enhancement-mode transistor, has a positive threshold voltage which means that it cannot conduct current at zero gate voltage and is normally off. A depletion-mode device, such as a depletion-mode transistor, has a negative threshold voltage which means that it can conduct current at zero gate voltage. These devices are normally on.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aP_bN_{(1-a-b)}$), for example. Aluminum gallium nitride and AlGaN refers to an alloy described by the formula $Al_xGa_{(1-x)}N$, where $0<x<1$.

Figure 16A:
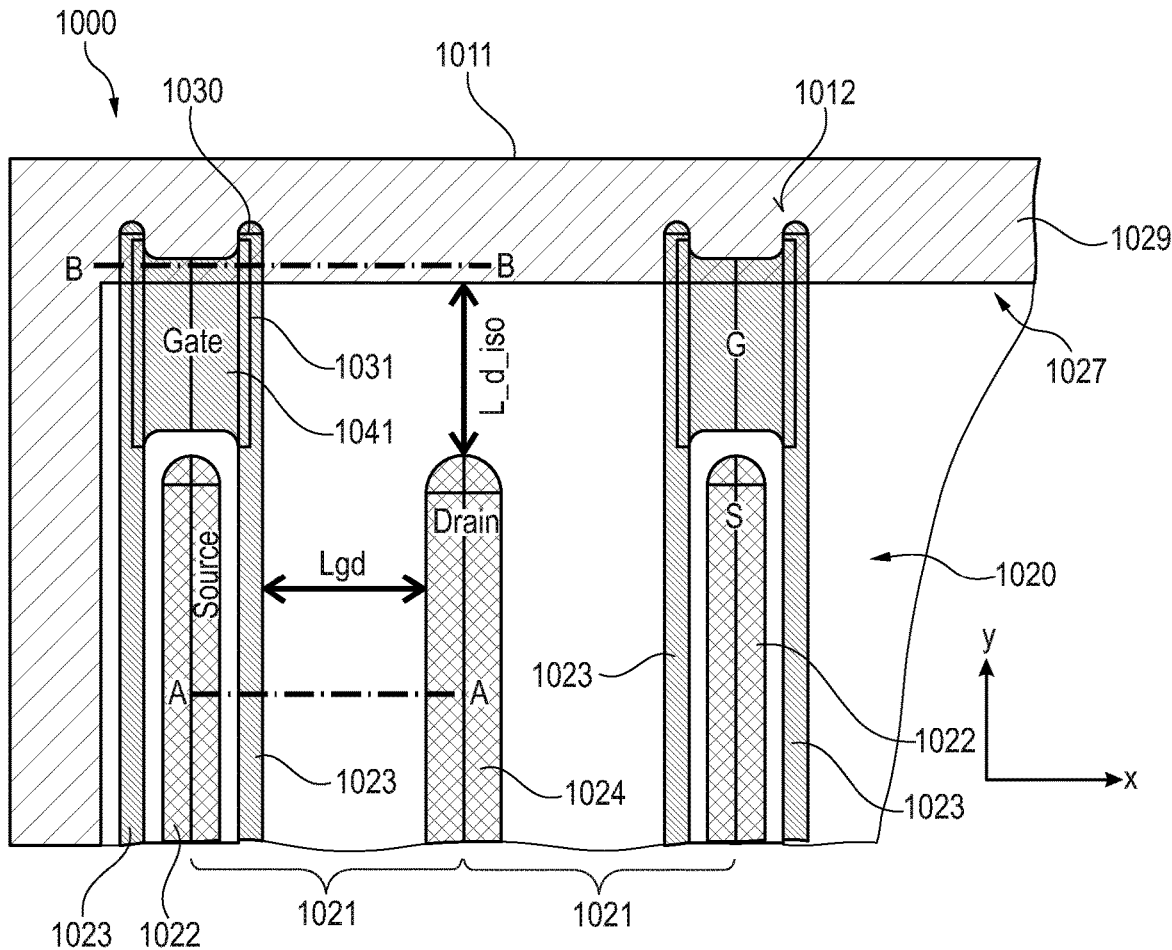
FIGS. 16a to 16c illustrate a plan view and cross-sectional views, respectively, of a comparison enhancement mode Group III nitride-based transistor device with an ohmic gate.
Figure 16B:
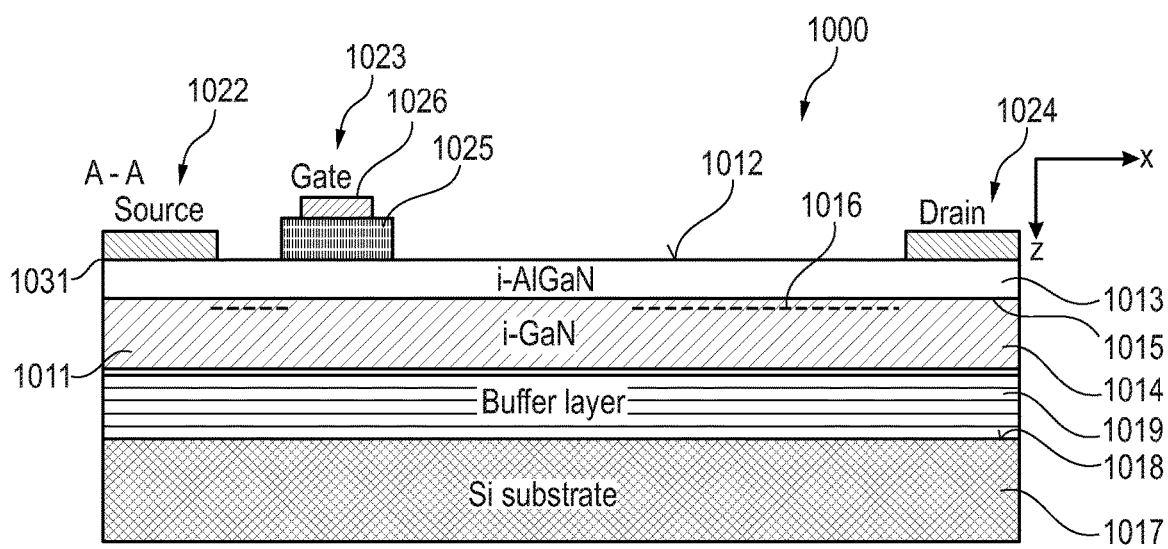
Figure 16C:
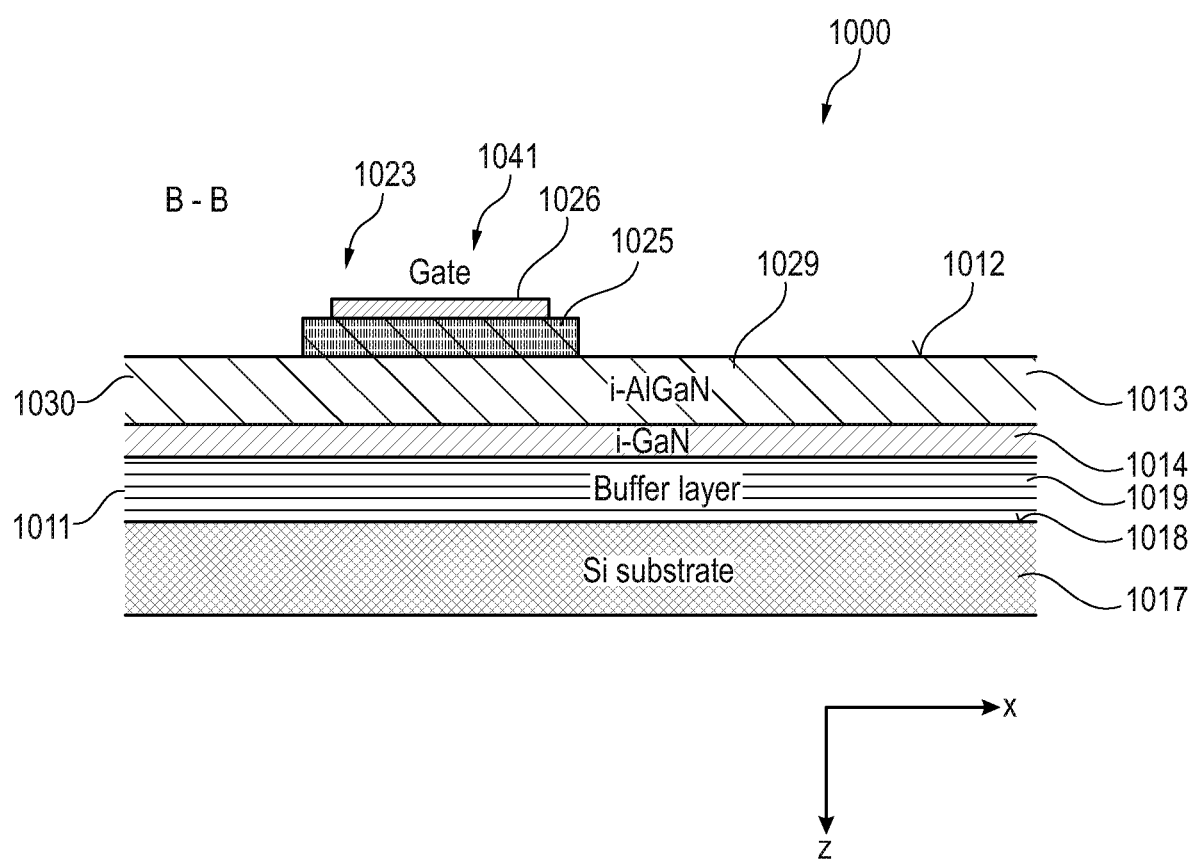

FIGS. 16a to 16c illustrates a comparison enhancement mode Group III nitride-based transistor device 1000 with an ohmic gate. FIG. 16a illustrates a plan view and FIG. 16b a cross-sectional view along the line A-A and FIG. 16c a cross-sectional view along the line B-B of FIG. 16a of a comparison enhancement mode Group III nitride-based transistor device 1000 with an ohmic gate.

The comparison enhancement mode Group III nitride-based transistor device 1000 includes a body 1011 comprising a first surface 1012. The body 1011 is formed from Group III nitrides and typically has a multilayer structure.

As can be seen in the cross-sectional views of FIGS. 16*b* and 16*c*, the body 1011 comprises a Group III nitride barrier layer 1013 arranged on a Group III nitride channel layer 1014 to form a heterojunction 1015 which is capable of supporting a two-dimensional carrier gas as is indicated schematically in the cross-sectional view of FIG. 16*b* by the dashed line 1016. The two-dimensional carrier gas may be a two-dimensional electron gas (2DEG), or a two-dimensional hole gas (2DHG) for example. The Group III nitride barrier layer 1013 has a different bandgap from the Group III nitride channel layer 1014 so that the heterojunction 1015 is formed at the interface between the two layers. The Group III nitride barrier layer 1013 may be formed of aluminium gallium nitride and the Group III nitride channel layer 1014 may be formed of gallium nitride.

The Group III nitride-based body 1011 may be formed by epitaxial growth of Group III nitride material on a substrate 1017 having a growth surface 1018 capable of supporting the epitaxial growth of at least one Group III nitride. The substrate 1017 may comprise a material other than a Group III nitride and be referred to as a foreign substrate. The substrate 1017 may be monocrystalline and may include monocrystalline silicon, for example <100> or <111> silicon, or sapphire or SiC.

The Group III nitride material is epitaxially grown on the growth surface 1018 so as to build up a multilayer structure of Group III nitrides of differing composition. A buffer or transition structure 1019 which is positioned between the first surface 1018 of the substrate 1017 and the Group III nitride channel layer 1014 may also be included. The Group III nitride barrier layer 1013 is positioned on the Group III nitride channel layer 1014 and may form the first surface 1012 of the body 1011.

The Group III nitride channel layer 1014 and the Group III nitride barrier layer 1013 may be intrinsically doped or unintentionally doped.

The enhancement mode Group III nitride-based transistor device 1000 includes at least one cell field 1020 that comprises a plurality of transistor cells 1021, each transistor cell 1021 having a transistor structure. Each cell comprises a source finger 1022, a gate finger 1023 and a drain finger 1024 that extend substantially parallel to one another on the first surface 1012 in a longitudinal direction which is indicated in the drawings by the arrow Y. The gate finger 1023 is arranged laterally between the source finger 1022 and the drain finger 1024.

Immediately adjacent transistor cells 1021 may share an electrode, in particular, a drain electrode, e.g. the drain finger 1024, or a source electrode, e.g. the source finger 1022.

As used herein, the expression "finger" is used to denote an elongate strip-like structure having a longest dimension or length and a shorter dimension or width. The longest dimension of the source, gate and drain fingers 1022, 1023, 1024 extends in the longitudinal direction, which is denoted as Y in the drawings, the width extends in a transverse direction, which is denoted as X in the drawings and is perpendicular to the longitudinal direction. The fingers have a thickness extending in the Z direction. X, Y and Z are cartesian coordinates.

The gate finger 1023 provides the transistor device 1000 with an ohmic gate and comprises a p-doped Group III nitride finger 1025 which is arranged on the first surface 1012 and a metallic gate finger 1026 that is arranged on the p-doped Group III nitride finger 1025.

The presence of the p-doped Group III nitride finger 1025 between the metallic gate finger 1026 and the Group III nitride barrier layer 1013 forms an enhancement mode device that is normally off from a structure that would otherwise provide a depletion mode device that is normally on. The metallic gate finger 1026 is formed from a material that forms an ohmic contact to the p-doped Group III nitride finger 1025.

The enhancement mode Group III nitride-based transistor device 1000 further comprises an edge region 1027 which laterally surrounds the plurality of transistor cells 1021.

The edge region 1027 comprises an edge termination structure which comprises an isolation ring 1029 that locally interrupts the two-dimensional carrier gas formed at the heterojunction 1015 in the edge region 1027. The isolation ring 1029 is formed by a damaged region, i.e. a discrete localised region with a damaged crystal structure. This damaged region can be formed by implantation and may comprise implanted species and/or an irregular crystal structure. This damage or interruption to the crystal structure prevents the formation of the two-dimensional charge gas in this region. The isolation ring 1029 may comprise an implantation region having a depth from the first surface 1012 that is greater than a depth of the heterojunction from the first surface 1012 so as to locally interrupt the two-dimensional carrier gas. The isolation ring 1029 extends to the peripheral edge of the first surface 1012 so that the upper region of the side faces of the body 1011 are formed from damaged material.

In other embodiments, the isolation ring 1029 is positioned such that its outboard edge is spaced at a distance from the side faces of the body 1011.

By interrupting the two-dimensional carrier gas in a predefined region having a continuous lateral ring form, the region of the body 1011 occupied by the isolation ring 1029 and any region of the body 1011 outboard of the isolation ring 1029 is electrically isolated from the region of the body 1011 inboard of the isolation ring 1029. Any two-dimensional charge gas formed at the heterojunction 1015 in the peripheral edge region 1027 outboard of the isolation ring 1029 is not electrically coupled to the two-dimensional charge gas inboard of the isolation ring 1029 and is, therefore, not at the same potential as the two-dimensional charge gas at regions within the cell field 1020.

As can be seen in the plan view of FIG. 16*a*, the isolation region 1029 also overlaps with distal ends of the gate fingers 23. The p-doped Group III nitride finger 1025 and the underlying portion of the body 1011 also have a damaged crystal structure in this region as is illustrated in the cross-sectional view of FIG. 16*c* by the hashed region. The implant used to form the isolation ring 1029 and create the ring-shaped regions with a damaged crystal structure is carried out after the formation of the Group III nitride body 1011 and p-doped Group III nitride layer 1025, but before the formation of the metal layers for the metallic gate finger 23 and source fingers 22 and drain fingers 24.

In principle, it is possible to use a Schottky gate in place of an ohmic gate in enhancement mode Group III nitride transistor devices. However, it was discovered that if the ohmic gate of the structure illustrated in FIGS. 16*a* to 16*c* is replaced by a Schottky gate, an increased gate leakage is observed. Further, a gate leakage behaviour, that is hole injection from the damaged or implanted part of the gate finger 1023 into the active area 20, that is different to the behaviour within the remainder of the active area 20, in which these interfaces are undamaged, is observed. This leads to an unwanted increase of the gate leakage.

It is believed that this increased gate leakage and localised different behaviour is caused, in the case of a Schottky gate, by the formation of a diode between the metallic gate finger 1025 and underlying portion of the two-dimensional carrier gas so that a diode with a different behaviour is formed in the damage region and in the undamaged region of the gate finger 2, in particular between the damaged portions 1030 of the p-doped Group III nitride finger 1025 and the adjoining interfaces with the gate metal 1026 and the Group III nitride barrier layer 1013 compared to the undamaged portions 1031. It is believed that these two different laterally diodes lead to a different type of behaviour and a different gate failure and gate leakage mechanism and a reduction in device performance. The interface between the two regions, i.e. the interface between the damage portion 1030 and undamaged portion 1031, is thought to the increased gate leakage behaviour. The region at which the undamaged region 1031 touches region damaged 1030 is thought to have a large influence on the increased gate leakage behaviour, because at these interface a cross talk between the two diode regions can occur more easily.

According to the invention, this different gate leakage behaviour and gate leakage should be avoided in order to increase the performance of the device. According to the invention, this is achieved by providing a p-doped Group III nitride runner and by locating this additional p-doped Group III nitride runner in an undamaged part of the edge region between the isolation ring and the transistor cells. This arrangement can be used to provide a reduced gate/drain leakage, also for higher voltage devices, for example, transistor devices with 100 V rating.

Figure 1B:
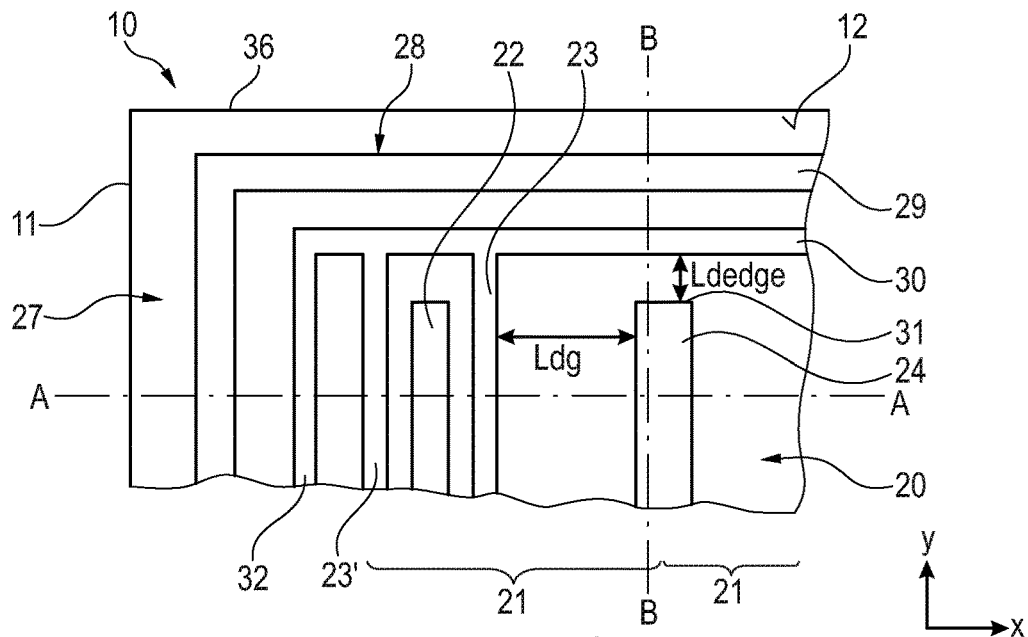
Figure 1C:
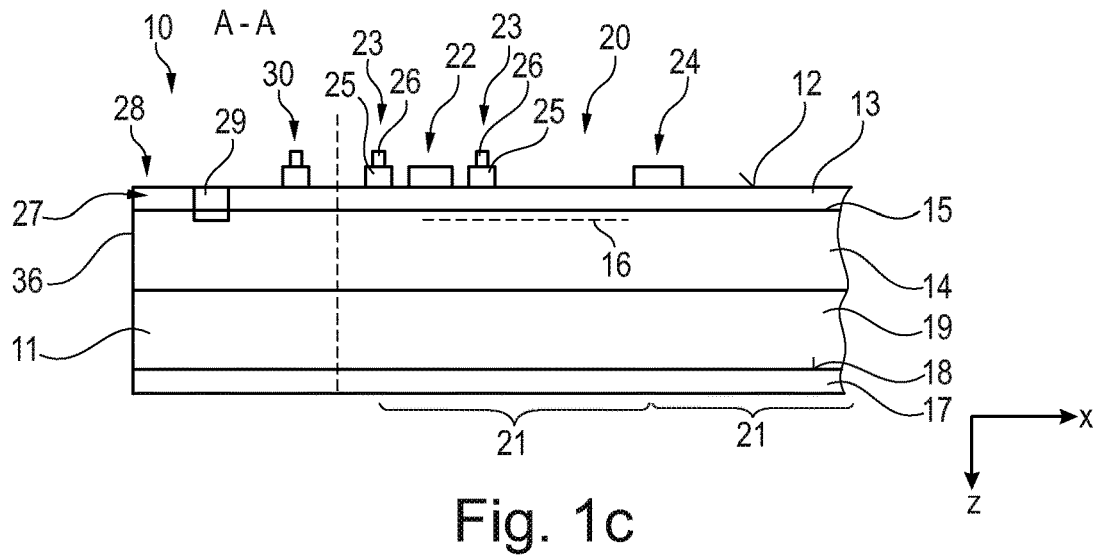

FIG. 1a illustrates a plan view and FIG. 1b an enlarged plan view of an enhancement mode Group III nitride-based transistor device 10 according to an embodiment. FIG. 1c illustrates a cross-sectional view along the line A-A of FIG. 1b and FIG. 1d illustrates a cross-sectional view along the line B-B of FIG. 1b of the enhancement mode Group III nitride-based transistor device 10.

In this embodiment, the enhancement mode Group III nitride-based transistor device 10 includes a Schottky gate. However, the designs disclosed herein may also be used for an enhancement mode Group III nitride-based transistor with an ohmic gate.

The enhancement mode Group III nitride-based transistor device 10 includes a body 11 comprising a first surface 12. The body 11 is formed from Group III nitrides and typically has a multilayer structure.

Figure 1D:
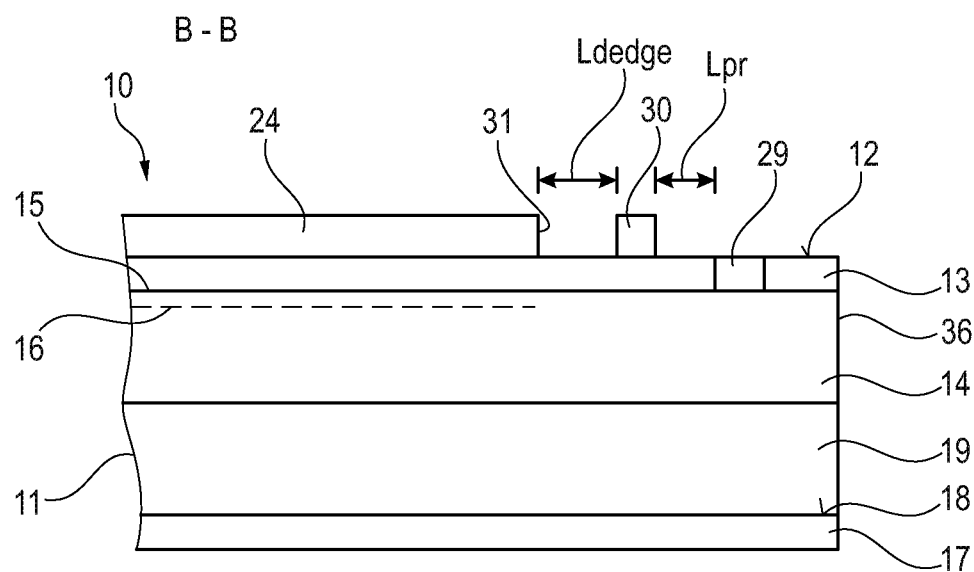

As can be seen in the cross-sectional views of FIGS. 1c and 1d, the body 11 comprises a Group III nitride barrier layer 13 arranged on a Group III nitride channel layer 14 to form a heterojunction 15 which is capable of supporting a two-dimensional carrier gas as is indicated schematically in the cross-sectional view of FIG. 1c by the dashed line 16. The two-dimensional carrier gas may be a two-dimensional electron gas (2DEG) or a two-dimensional hole gas (2DHG), for example. The Group III nitride barrier layer 13 has a different bandgap from the Group III nitride channel layer 14 so that the heterojunction 15 is formed at the interface between the two layers. The Group III nitride barrier layer 13 may be formed of aluminium gallium nitride and the Group III nitride channel layer 14 may be formed of gallium nitride.

The Group III nitride-based body 11 may be formed by epitaxial growth of Group III nitride material on a substrate 17 having a growth surface 18 capable of supporting the epitaxial growth of at least one Group III nitride. The substrate 17 may comprise a material other than a Group III nitride and be referred to as a foreign substrate. The substrate 17 may be monocrystalline and may include monocrystalline silicon, for example <100> or <111> silicon, or sapphire. The Group III nitride material is epitaxially grown on the growth surface 18 so as to build up a multilayer structure of Group III nitrides of differing composition. The enhancement mode Group III nitride-based transistor device 10 may further include a buffer or transition structure 19 which is positioned between the first surface 18 of the substrate 17 and the Group III nitride channel layer 14. The Group III nitride barrier layer 13 is positioned on the Group III nitride channel layer 14 and may form the first surface 12 of the body 11. The Group III nitride channel layer 14 and the Group III nitride barrier layer 13 may be intrinsically doped or unintentionally doped.

The enhancement mode Group III nitride-based transistor device 10 includes at least one cell field 20 that comprises a plurality of transistor cells 21, each transistor cell 21 having a transistor structure. Each cell comprises a source finger 22, a gate finger 23 and a drain finger 24 that extend substantially parallel to one another on the first surface 12 in a longitudinal direction which is indicated in the drawings by the arrow Y. The gate finger 23 is arranged laterally between the source finger 22 and the drain finger 24.

Immediately adjacent transistor cells 21 may share an electrode, in particular, a drain electrode, e.g. the drain finger 24, or a source electrode, e.g. the source finger 22, as indicated in FIGS. 1a and 1b.

The expression "finger" is used herein to denote an elongate strip-like structure having a longest dimension or length and a shorter dimension or width. The longest dimension of the source, gate and drain fingers 22, 23, 24 extends in the longitudinal direction, which is denoted as Y in the drawings, the width extends in a transverse direction, which is denoted as X in the drawings and is perpendicular to the longitudinal direction. The fingers have a thickness extending in the Z direction. X, Y and Z are cartesian coordinates.

The gate finger 23 comprises a p-doped Group III nitride finger 25 which is arranged between a metallic gate finger 26 and the first surface 12. The p-doped Group III nitride finger 25 also extends substantially parallel to the source finger 22 and drain finger 24 in the longitudinal direction Y. The metallic gate finger 26 is arranged on the upper surface of the p-doped Group III nitride finger 25 and also extends substantially parallel to the source finger 22 and drain finger 24 in addition to the p-doped Group III nitride finger 25.

The p-doped Group III nitride finger 25 provides holes and acts as a hole injector into the two-dimensional electron gas formed at the heterojunction 15. The presence of the p-doped Group III nitride finger 25 between the metallic gate finger 26 and the Group III nitride barrier layer 13 forms an enhancement mode device that is normally off from a structure that would otherwise provide a depletion mode device that is normally on. By selecting a suitable material for the metallic gate finger 26 a Schottky gate or an ohmic gate may be provided. The metallic gate finger 26 may comprise TiN to form a Schottky contact to the p-doped Group III nitride finger 26 so that the gate finger 23 provides a Schottky gate.

The enhancement mode Group III nitride-based transistor device 10 further comprises an edge region 27 which laterally surrounds the plurality of transistor cells 21. The edge region 27 is arranged at the peripheral edge of the body 11 of the enhancement mode Group III nitride-based transistor device 10.

In some embodiments, the enhancement mode Group III nitride-based transistor device includes a single cell field 20 and the edge region 27 laterally surrounds the cell field 20. In some embodiments, such as that illustrated in FIG. 9b, the enhancement mode Group III nitride-based transistor device includes a plurality of cell fields 20, 20' that are arranged laterally adjacent one another in the body 11. In these embodiments, a single edge region 27 surrounds all of the cell fields 20, 20' at the periphery of the body 11.

The edge region 27 comprises an edge termination structure 28 which comprises an isolation ring 29 that locally interrupts the two-dimensional carrier gas formed at the heterojunction 15 in the edge region 27. The isolation ring 29 may continuously and uninterruptedly laterally surround the plurality of transistor cells 21, as illustrated in FIG. 1a.

In some embodiments, the isolation ring 29 is formed by a damaged region, i.e. a discrete localised region with a damaged crystal structure. This damaged region can be formed by implantation and may comprise implanted species, e.g. ions, and/or an irregular crystal structure. This damage or interruption to the crystal structure prevents the formation of the two-dimensional charge gas in this region. The isolation ring 29 may comprise an implantation region having a depth from the first surface that is greater than a depth of the heterojunction 15 from the first surface so as to locally interrupt the two-dimensional carrier gas.

In some embodiments, the isolation ring 29 comprises a recess that interrupts the heterojunction 15 and, therefore, the two-dimensional carrier gas. In embodiments, in which the isolation ring 29 is provided by a damaged region, for example formed by implant, the heterojunction 15 still is in place but due to the damage to the crystal structure and, if present, implanted ions, the two-dimensional carrier gas (2DEG or 2DHG) cannot form. In depths of the body 11 deeper than the position of the two-dimensional carrier gas, the damaged crystal structure, or implanted ions if present, act as a dopant which prevents lateral conduction.

In some embodiments, the isolation ring 29 is positioned in the first surface 12 and spaced at a distance from the periphery 36 of the first surface 12 that is defined by the side faces of the body 11. In some embodiments, the isolation ring 29 extends to the periphery 36 of the first surface 12 so that there is no region of the body 11 outboard of the isolation ring 29.

By interrupting the two-dimensional charge gas in a predefined region having a continuous lateral ring form, the region of the body 11 outboard of the isolation ring 29 is electrically isolated from the region of the body 11 inboard of the isolation ring 29. Any two-dimensional charge gas formed at the heterojunction 15 in the peripheral edge region 27 outboard of the isolation ring 29 is not electrically coupled to the two-dimensional charge gas inboard of the isolation ring 29. The peripheral edge region 27 outboard of the isolation ring 29 is electrically floating.

In some embodiments, the isolation ring 29 extends to the periphery 36 of the first surface 12 so that there is no region of the body 11 that is outboard of the isolation ring 29. In embodiments, in which the isolation ring 29 extends to the peripheral edge 36 of the body 11, the side faces of the body 11 are not electrically coupled to the two-dimensional charge gas inboard of the isolation ring 29.

In some embodiments, the isolation ring 29 comprises a recess formed in the body 11 and extending from first surface 12 to a depth of at least the interface 15 between the Group III nitride barrier layer 13 and the Group III nitride channel layer 14. The isolation ring 29 may comprise a recess comprising insulating material, the recess having a base that is positioned at a depth from the first surface 12 that is greater than the depth of the heterojunction 15 from the first surface 12 so as to locally interrupt the two-dimensional carrier gas. The recess may be filled with an insulating material, for example an oxide.

The edge termination structure 28 further includes a p-doped Group III nitride runner 30 that extends transversely to the longitudinal direction, as indicated by the arrow X in the drawings. The p-doped Group III nitride runner 30 is located laterally between the isolation ring 29 and a first end 31 of the drain finger 24. In embodiments in which the first cell field 20 includes a plurality of drain fingers 24, the p-doped Group III nitride runner 30 is located laterally between the first end 31 of each of the drain fingers 24 and the isolation ring 29. The p-doped Group III nitride runner 30 is spaced apart in the longitudinal direction from the first end 31 of each of the drain fingers 24.

The gate fingers 23 extend to and may be integral with the p-doped Group III nitride runner 30. The first ends 31 of the source fingers 22 are spaced apart from the inboard edge of the p-doped Group III nitride runner as are the first ends 31 of the drain fingers 24.

The p-doped Group III nitride runner 30 may include gallium nitride, for example, or aluminium gallium nitride. The p-doped Group III nitride runner 30 may include the same Group III nitride material as the Group III nitride finger 25 which forms part of the gate finger 23. The p-doped Group III nitride runner 30 may also be formed using the same processing steps as the p-doped Group III nitride finger 25 of the gate finger 23. A metallic runner may be positioned on the p-doped Group III nitride runner 30 which has the same general lateral form as the p-doped Group III nitride runner. The metallic runner located forms an interface with the p-doped Group III nitride runner 30. This metallic runner may be formed using the same processes as the metallic gate runner 26. The p-doped Group III nitride material that, for example forms the runner 30 and gate finger 25, may be doped with magnesium as the p-doped dopants.

The p-doped Group III nitride runner 30 is laterally spaced apart from the first end 31 of the drain finger 24. The distance between the p-doped Group III nitride runner 30 and the first end 31 of the drain finger 24 in the Y direction is denoted in the drawings as $L_{dedge}$ and is larger than the distance between the drain finger 24 and the gate finger 23, in the transverse x direction, indicated in the drawings as $L_{GD}$, of the Group III nitride-based transistor cells 21, i.e. $L_{dedge} > L_{GD}$). The reverse relationship in which $L_{dedge} < L_{GD}$) and an arrangement in which $L_{dedge} = L_{GD}$ are also possible.

In some embodiments, such that that illustrated in FIGS. 1a to 1d, the p-doped Group III nitride runner 30 is also laterally spaced apart from the first ends 31 of the source fingers 22 by a distance.

As used herein, when one element is laterally spaced apart from another element or laterally spaced apart by a distance from another element, the minimum lateral distance between these two elements is greater than the lateral accuracy that is typically obtained using the particular lithographic technique used to structure the elements. For example, the minimum lateral distance may be around 100 nm.

FIG. 1d illustrates a cross-sectional view along the line B-B and illustrates the lateral spacing $L_{dedge}$ between the end 31 of the drain finger 24 and the p-doped Group III nitride runner 30 and the lateral spacing between the p-doped Group III nitride runner 30 and the isolation ring 29, which is denoted as $L_{pr}$ in FIG. 1d. The spacing between the p-doped Group III nitride runner and the isolation ring 29 is greater than the minimum lithographic alignment capability. For example, the spacing $L_{pr}$ may be at least 100 nm.

In some embodiments, the p-doped Group III nitride runner 30 is electrically floating. In other embodiments, the p-doped Group III nitride runner 30 is electrically coupled to source potential or electrically coupled to gate potential.

In embodiments in which the p-doped Group III nitride runner 30 is electrically connected to source potential, the p-doped Group III nitride runner 30 may be coupled to one or more source fingers 22 and may be connected to one or more of the source fingers 22 by a common metal or metallic layer.

In embodiments in which the p-doped Group III nitride runner 30 is electrically connected to gate potential, the p-doped Group III nitride runner 30 may be coupled to one or more of the gate fingers 23 and may be directly connected to, for example integral with, one or more of the gate fingers 23. For example, the p-doped Group III nitride runner 30 may be integral with the p-doped Group III nitride finger 25 of the gate finger 23. In embodiments, in which a metallic runner is positioned on and forms an interface with the p-doped Group III nitride runner 30, this metallic runner may be electrically connected to the metallic gate finger 26. In some embodiments, the metallic runner positioned on the p-doped Group III nitride runner 30 is integral with the metallic gate finger 26.

In the edge termination structure 28, the p-doped Group III nitride runner 30, which faces towards the cell field 20, is undamaged, i.e. has an undamaged crystal structure, since it is positioned laterally between and spaced apart from the isolation ring 29 and the cell field 20, in particular, the first end 31 of the drain finger 24. Thus, the transistor cells 21 are terminated at the first end by an undamaged p-doped Group III nitride runner 30. This arrangement is used to provide a reduced gate/drain leakage, also for higher voltage devices, for example, transistor devices with a 100 V rating.

For embodiments in which the p-doped Group III nitride runner 30 is connected to the gate fingers 23, damage to the crystal structure of the p-doped Group III nitride finger 25 of the gate finger 23 and to the underlying interfaces, such as the interfaces between the p-doped Group III nitride finger 23 and the Group III nitride barrier layer 13 and the interface at the heterojunction 15 would lead to increased gate leakage and a gate leakage behaviour, that is hole injection from the damaged or implanted part of the gate finger 23 into the active area, that is different to the behaviour within the remainder of the active area in which these interfaces are undamaged.

Different types of behaviour and a different gate failure and gate leakage mechanism between the p-doped Group III nitride finger 25 and the adjoining interfaces with the gate metal and the Group III nitride barrier layer 13 is avoided by providing the additional p-doped Group III nitride runner 30 and by locating the additional p-doped Group III nitride runner 30 in an undamaged part of the edge region 27. The p-doped Group III nitride runner 30 and the gate fingers 25 are entirely undamaged in some embodiments. The electrical isolation provided by the isolation ring 29 that is positioned laterally outboard of the p-doped Group III nitride runner 30 is still retained.

As used herein "inboard" refers to a direction in the X-Y plane facing towards the centre of the first surface 12 and "outboard" refers to a direction, in the X-Y plane, facing towards the edge or periphery of the first surface 12, the edge being the lateral extent of the first surface 12 defined by the side faces of the body 11.

Whilst the enhancement mode transistor Group III nitride devices according to any of the embodiments described herein may have a Schottky gate and different behaviour of the gate and gate leakage can be avoided by the position of the undamaged p-doped Group III nitride material in the edge region, the structure according to any of the embodiments described herein may also be used for the enhancement mode transistor Group III nitride devices with an ohmic gate.

In some embodiments, such as that illustrated in FIG. 1a, the p-doped Group III nitride runner 30 further includes two longitudinal extensions 32, 33 and a transverse extension 34 that extends parallel to the p-doped Group III runner 30 and perpendicularly to the longitudinal extensions 32, 33. The transverse extension 34 is spaced apart from the second distal end 35 of the drain finger 24, the second distal end 35 opposing the first end 31. The p-doped Group III nitride runner 30 and its extensions 32, 33, 34 together form a continuous ring of p-doped Group III nitride material is formed on the first surface 12 that laterally surrounds the periphery of the cell field 20 and that is located laterally inboard of the isolation ring 29.

The first extension 32 and second extension 33 of the p-doped Group III nitride runner are positioned laterally outboard of the laterally outermost finger, which may be a gate finger 23' and are laterally spaced apart from the isolation ring 29. In some embodiments, the first extension 32 is laterally spaced apart from the outermost finger, e.g. gate finger 23' and the second extension 33 is laterally spaced apart from the opposing outermost finger, which is a gate finger 23' in the embodiment illustrated in FIG. 1a.

Figure 2A:
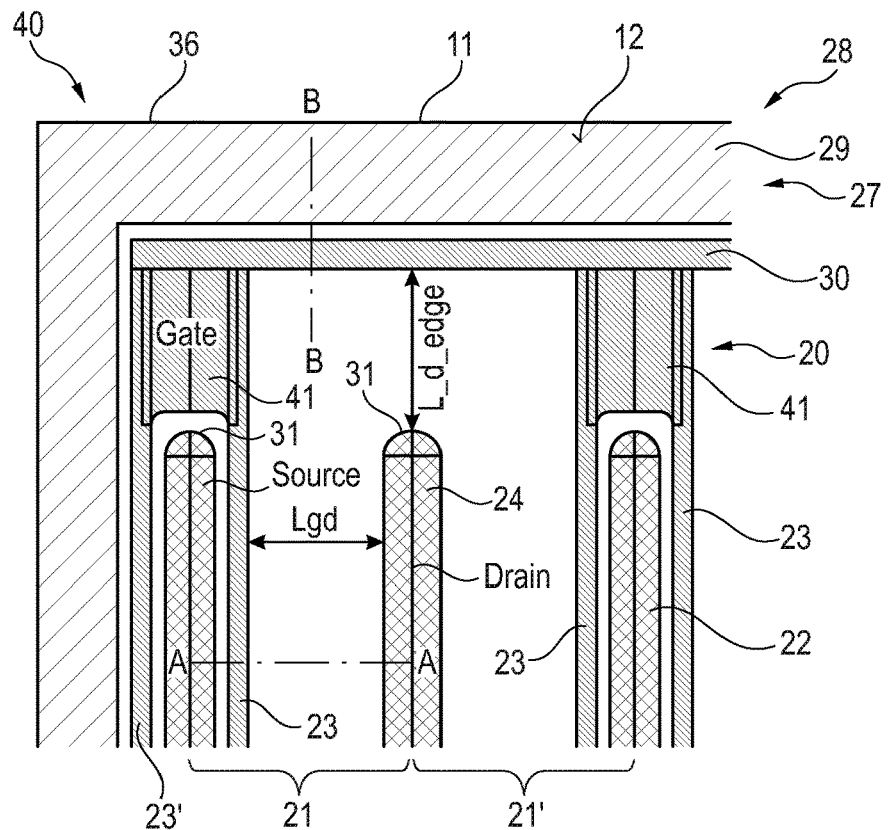
FIGS. 2a to 2c illustrate a plan view and cross-sectional views along the line A-A and the line B-B of FIG. 2a, respectively, of an enhancement mode Group III nitride-based transistor device according to an embodiment.
Figure 2B:
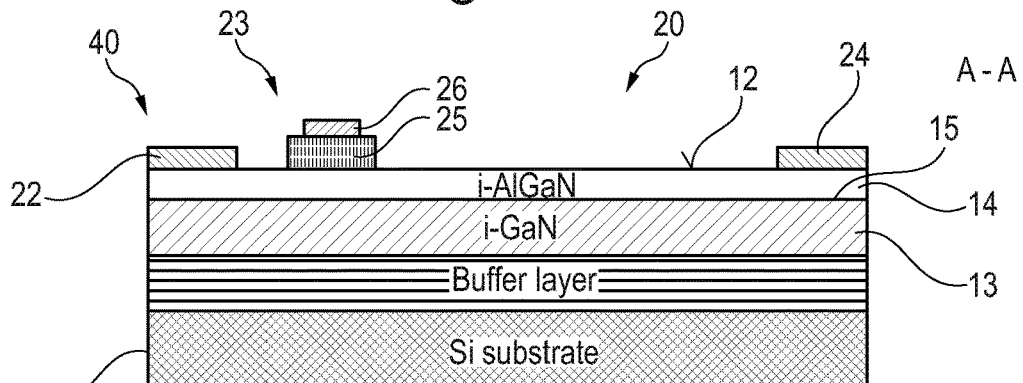
Figure 2C:
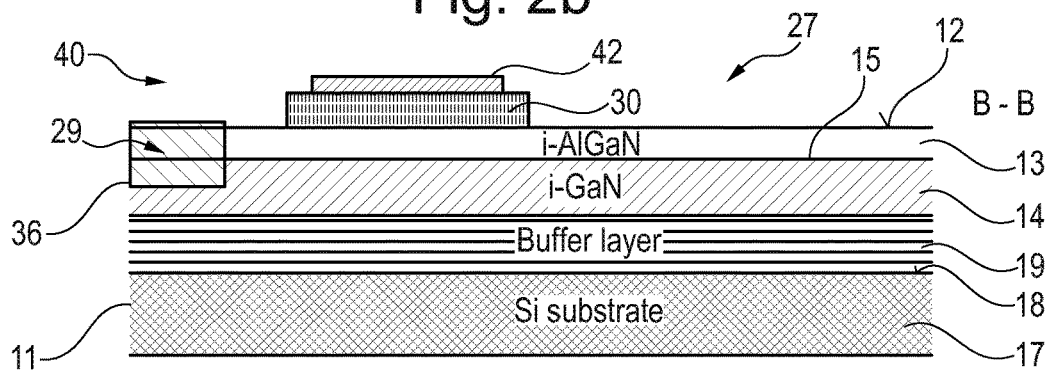

In other embodiments, the longitudinal extensions 32, 33 are omitted. In these embodiments, the outermost gate fingers 23' may form a ring with the p-doped Group III nitride runner 30 and the transverse extension 34. FIGS. 2a to 2c illustrate an example of such an arrangement.

Herein, features including adjoining longitudinal and transverse portions, such as the p-doped Group III nitride runner 30 and the extensions 32, 33, the isolation ring 29 etc may have rounded or curved joints rather than the perpendicular shape shown in the plan views. The first ends 31 and second distal ends 35 of the fingers 22, 23, 24 may also be curved or rounded in plan view.

FIG. 2a illustrates a plan view of a semiconductor device 40 according to an embodiment. FIG. 2b illustrates a cross-sectional view along the line A-A of FIG. 2a and FIG. 2c illustrates a cross-sectional view along the line B-B of FIG. 2a. The semiconductor device 40 is an enhancement mode Group III nitride-based transistor device which includes semiconductor body 11, a cell field 20 including a plurality of cells 21 of which two cells 21, 21' with a drain finger 24 common to the adjacent cells 21, 21' are illustrated in FIGS. 2a to 2c. In the plan view of FIG. 2a, a corner of the first surface 12 is illustrated in which adjoining longitudinal and transverse portions of the isolation ring 29 are depicted.

Each transistor cell 21 includes an elongate source finger 22, an elongate gate finger 23 and an elongate drain finger 24, as in the embodiment illustrated in FIGS. 1a to 1d, which have a long direction extending in the longitudinal or Y direction.

The semiconductor device 40 also includes an edge region 27 which includes an edge termination structure 28 including the isolation ring 29 and p-doped Group III nitride runner 30 which extends transversely to the longitudinal direction and is located laterally between the isolation ring 29 and the first end 31 of the drain finger 24.

The isolation ring 29 includes an implanted continuous ring-shaped region has a depth which locally interrupts the two-dimensional carrier gas formed at the heterojunction 15 between the Group III nitride barrier layer 13 and the Group III nitride channel layer 14. In this embodiment, the isolation ring 29 extends to the peripheral edge 36 of the body 11.

In the embodiment illustrated in FIGS. 2a to 2c, the p-doped Group III nitride runner 30 is electrically coupled to gate potential. In the embodiment illustrated in FIGS. 2a to 2c, the gate fingers 23, 23' that are positioned on two opposing sides of the source finger 22 extend further towards the edge region 27 than the source finger 22 and drain finger 24 so that they are physically connected to the p-doped Group III nitride runner 30. The first end 31 of the drain finger 24 is spaced at a distance the edge from the p-doped Group III nitride runner 30.

The p-doped Group III nitride runner 30 extends from and is integral with the p-doped Group III nitride finger 25 of the gate fingers 23, 23'. The p-doped Group III nitride runner 30 may also include a metallic layer 42 positioned on the p-doped Group III nitride runner 30 which is physically connected to the metallic gate runner 26 of the gate finger 23. The gate fingers 23 and the p-doped Group III nitride runner 30 as well as the gate metal 26 and metallic layer 42 may be fabricated using the same process steps.

In some embodiments, the gate fingers 23, 23' positioned on either side of a particular source finger 22 are electrically coupled to one another by a gate connection region 41 which is spaced apart from the first end 31 of the source finger 22 and extends between the two gate fingers 23, 23'. A second gate connection region, which is not illustrated in FIG. 2a, may be positioned between the two gate fingers 23, 23' and spaced apart from the second distal end 35 of the source finger 22 such that the gate fingers 23, 23' and the gate extensions 41 form a ring that continuously surrounds the source finger 22. The gate connection region 41 is also physically connected to the p-doped Group III nitride runner 30. The gate connection region 41 may include a p-doped Group III nitride layer and a metallic layer on the p-doped Group III nitride layer similar to the structure of the gate fingers 23, 23'. The p-doped Group III nitride layer and the metallic layer of the gate connection region 41 may be integral with the p-doped Group III nitride finger 26 and metallic gate finger 26, respectively, of the gate fingers 23, 23'.

The laterally outermost or outboard gate finger 23' is located laterally between the source finger 22 and the isolation ring 29 and extends substantially perpendicularly to the p-doped Group III nitride runner 30 and in the Y direction. As the p-doped Group III nitride runner 30 and the laterally outermost p-doped Group III nitride gate fingers 23' are integral, they together form a continuous ring that laterally surrounds the cell field 20.

In the embodiment illustrated in FIGS. 2a to 2c, the p-doped Group III nitride runner 30 is laterally spaced apart from the isolation ring 29 and the gate runner 23' is also spaced laterally spaced apart from the isolation ring 29. Additionally, the p-doped Group III nitride runner 30 and the gate fingers 23 positioned on opposing sides of the drain finger 24 also form a continuous ring that continuous surrounds and is spaced apart from the drain finger 24.

The p-doped Group III nitride runner 30 and the gate fingers 23 positioned on opposing sides of the source finger 22 also form a continuous ring that continuous surrounds and is spaced apart from the source finger 22.

FIG. 3a illustrates a plan view, FIG. 3b a cross-sectional view along the line A-A of FIG. 3a and FIG. 3c a cross-sectional view along the line B-B of FIG. 3a of a semiconductor device including an enhancement mode Group III nitride-based transistor device 50 according to an embodiment.

The enhancement mode Group III nitride-based transistor device 50 has a layout and structure that is similar to that illustrated in FIG. 2a in which the p-doped Group III nitride runner 30 is physically connected to the gate fingers 23, 23' and is, therefore, electrically coupled to gate potential.

The p-doped Group III nitride runner 30 and the outermost gate fingers 23' provide a continuous ring that surrounds the cell field 20, a continuous ring that surrounds each of the drain fingers 24 and a continuous ring that surrounds each of the source fingers 22.

The enhancement mode Group III nitride-based transistor device 50 further includes a field plate 51 which is positioned between the gate finger 23 and the drain finger 24 and which may vertically overlap with drain side portion of the gate finger 23. The field plate 51 may be elongate and extend in the longitudinal direction Y along the entire length of the gate finger 23.

In some embodiments, the field plate 51 also extends in the transverse or X direction between the gate fingers 23 positioned adjacent opposing sides of the drain finger 24. An outboard portion of the field plate 51 may overlap with an inboard portion of the p-doped Group III nitride runner 30. An inboard portion of the field plate 51 may be spaced apart from the first ends 31 of the drain fingers 24 and also from the opposing ends 35 of the drain fingers which cannot be seen in the views of FIGS. 3a to 3c. In some embodiments, the field plate 51 forms a continuous ring that laterally surrounds the area of the cell field that is located between the gate finger 23 and the laterally adjacent drain finger 24.

The field plate 51 may have different forms. For example, the field plate 51 may have a slanted structure or a stepped structure. In some embodiments, the field plate 51 may include two or more subfield plates which are physically separated from one another by a dielectric layer. Each of the subfield plates may form rings as seen in the plan view of FIGS. 3a to 3c.

Figure 4:
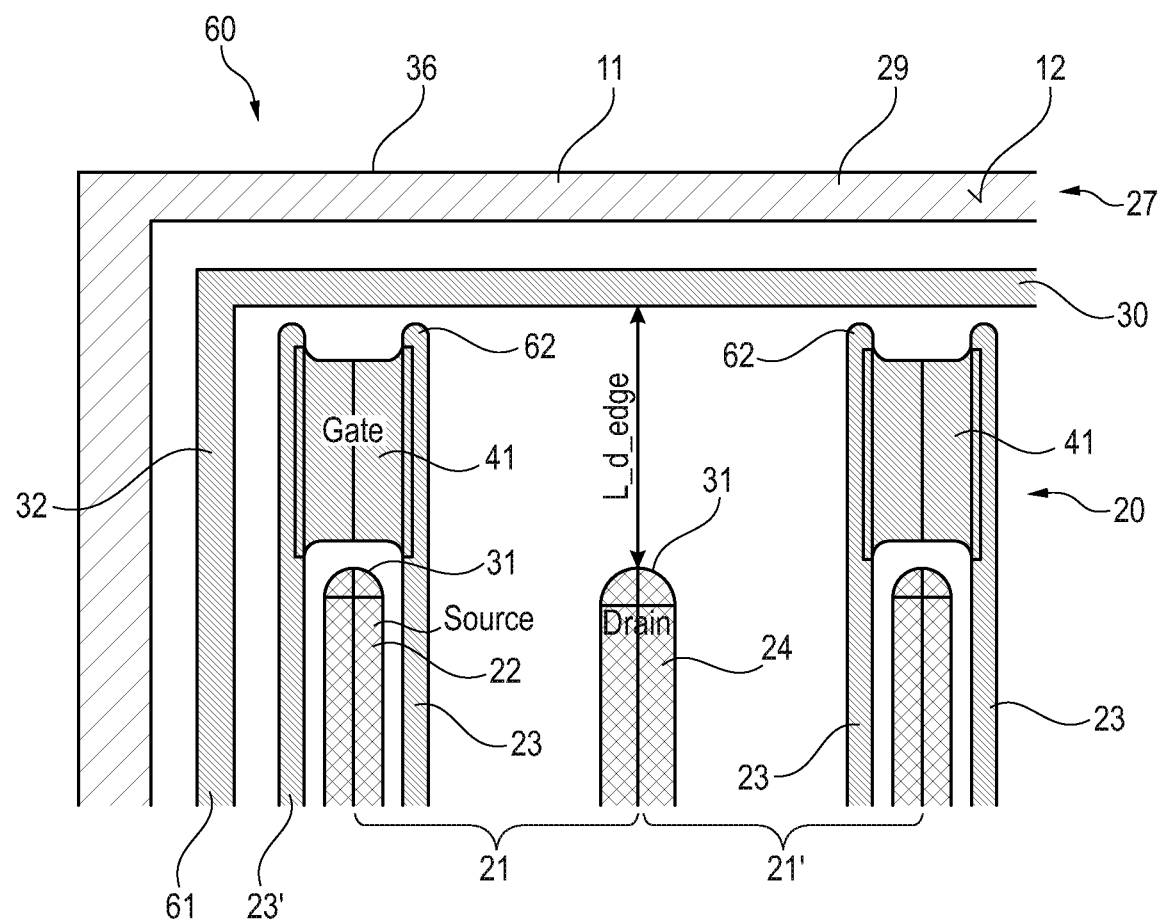
FIG. 4 illustrates a plan view of an enhancement mode Group III nitride-based transistor device according to an embodiment.

FIG. 4 illustrates a plan view of a portion of a semiconductor device including an enhancement mode Group III nitride-based transistor device 60 which includes a p-doped Group III nitride runner 30 which extends transversely, in the X direction. The p-doped Group III nitride runner 30 includes a first extension 32 extending in the longitudinal direction Y and a second extension (not seen in the partial plan view of FIG. 4) extending in a longitudinal direction at the opposing lateral side of the cell field 20 and a third extension, which can also not be seen in the plan view of FIG. 4, extending in the transverse direction between the two longitudinal extensions 32 in order to form a continuous ring 61 similar to that shown in FIG. 1a. The p-doped Group III nitride runner 30 is electrically coupled to source potential in this embodiment.

The continuous ring 61 of the p-doped Group III nitride material laterally surrounds the cell field 20 and is laterally spaced apart from the isolation ring 29 and from all of the drain, source and gate fingers of the transistor cells 21 including the outermost gate finger 23', inner gate fingers 23 and the drain fingers 24. The continuous ring 61 is also laterally spaced apart from the opposing ends 35 of the drain fingers 24.

In the embodiment illustrated in FIG. 4, the gate electrodes 23 and 23' which are positioned on opposing sides of the source finger 22 are electrically coupled together by a gate connection 41 extending in the transverse direction which is spaced apart from the first end 31 of the source finger 22. The gate electrodes 23 and 23' which are positioned on opposing sides of the source finger 22 are also electrically coupled together by a second gate connection extending in the transverse direction which is spaced apart from the opposing second end 35 of the source finger 22. Each source finger 22 is laterally surrounded by a ring of p-doped Group III nitride material formed by the gate connection extensions 41 and the p-doped Group III nitride finger of the gate fingers 23, 23'. The p-doped Group III nitride runner 30 as well as the longitudinal extension 32 and the parallel longitudinal extension 33, which cannot be seen in the view of FIG. 4, are laterally spaced apart from the gate fingers 23', 23 and the gate connection extension 41 as well as from the opposing second ends 35 of the drain finger 24 and the second ends of the gate fingers 23, 23' and the second gate connection extension.

The continuous ring 61 of the p-doped Group III nitride material laterally surrounds the cell field 20 and is laterally spaced apart from the isolation ring 29 and from all of the drain, source and gate fingers of the transistor cells 21 including the outermost gate finger 23', the inner gate fingers 23 and gate connection extension 41 and the drain fingers 24.

The distance between the p-doped Group III nitride runner 30 and the gate connection extension 41 of the gate fingers 23 23' is less than the distance $L_{dedge}$ between the p-doped Group III nitride runner 30 and the first end 31 of the drain electrode 24.

Figure 5:
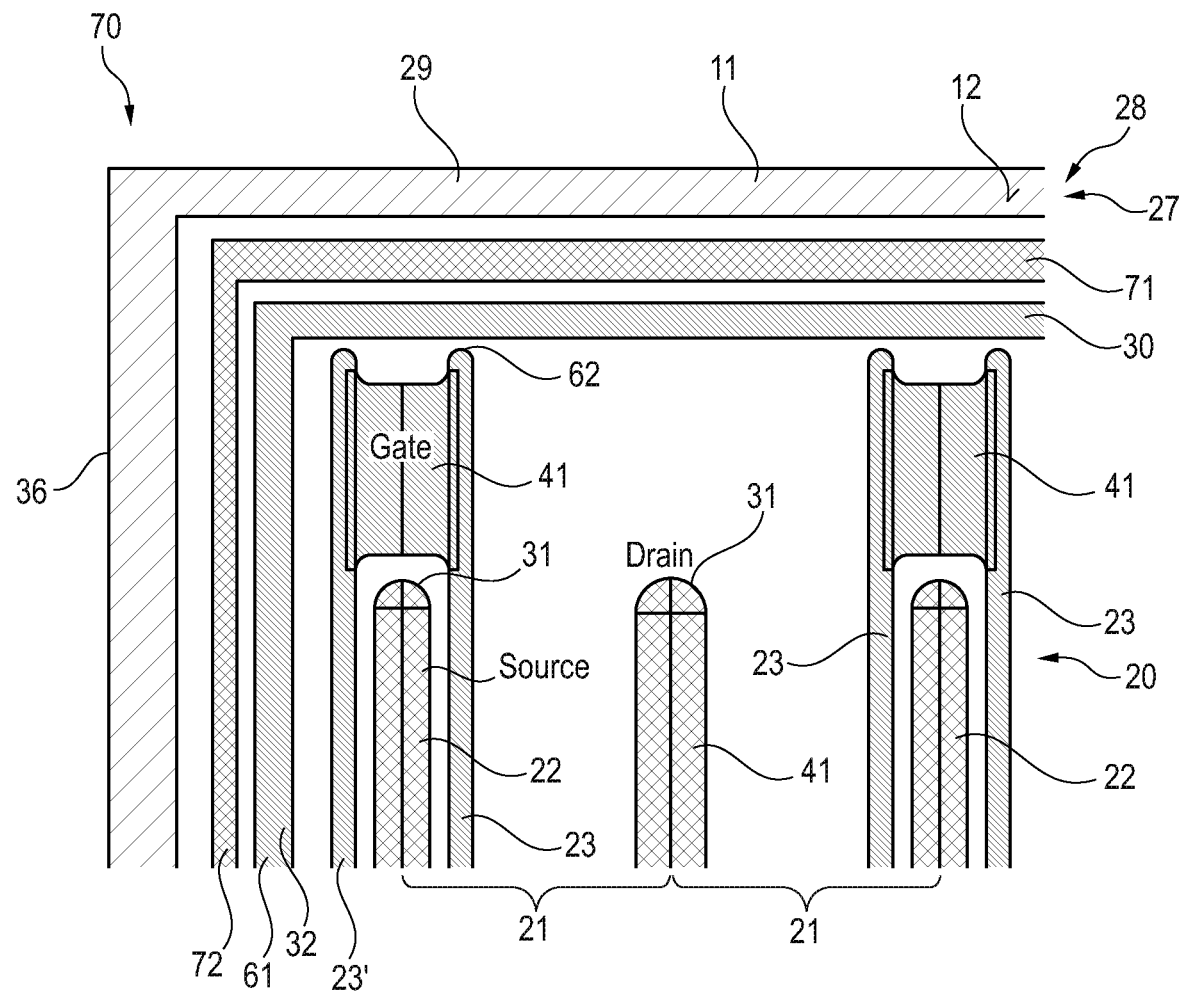
FIG. 5 illustrates a plan view of an enhancement mode Group III nitride-based transistor device according to an embodiment.

FIG. 5 illustrates a plan view of a semiconductor device including an enhancement mode Group III nitride-based transistor device 70 which has a p-doped Group III nitride runner 30 including extensions 32, 33, 34 so as to form a continuous ring 61 around the cell field 20.

The p-doped Group III nitride runner 30 of the enhancement mode Group III nitride-based transistor device 70 is electrically coupled to source potential and spaced apart from the gate fingers 23, gate connection region 41 and drain fingers 24 as in the embodiment illustrated in FIG. 4. In embodiments including a plurality of cell fields 20, a separate p-doped Group III nitride ring 61 formed from the runner 30 and extensions 32, 33, 34 may laterally surround each of the cell fields 20.

In the embodiment illustrated in FIG. 5, edge termination structure 28 of the enhancement mode Group III nitride-based transistor device 70 further includes an additional runner 71 which is laterally located between and laterally spaced apart from the p-doped Group III nitride runner 30 and the isolation ring 29. The additional runner 71 extends in the transverse direction. The addition runner 71 may also include extensions 72 extending in the longitudinal direction and in the transverse direction and to form a ring-shape which laterally surrounds and is positioned outboard of the continuous ring 61 formed by the doped Group III nitride runner 30 and its extensions 32, 33, 34. The additional runner 71 may be electrically coupled to source potential.

In contrast to the p-doped Group III nitride runner 30, the additional runner 71 may be formed of a metal layer only that is positioned on the first surface 12 of the body 11. In some embodiments, the p-doped Group III nitride ring 61 and the additional metal runner 71 are both coupled to source potential. In some embodiments source potential is ground.

In some embodiments, the runner 71 may form an ohmic contact to the two-dimensional charge gas formed at the heterojunction 15 between the Group III nitride channel layer 14 and the Group III nitride barrier layer 13.

In the embodiments illustrated in FIGS. 1a to 5, the outboard edge of the p-doped Group III nitride runner 30 is laterally spaced apart from the isolation ring 29 by a distance, for example a gap of at least 100 nm.

In some embodiments, the p-doped Group III nitride runner 30 may partially overlap the isolation ring 29.

Figure 6:
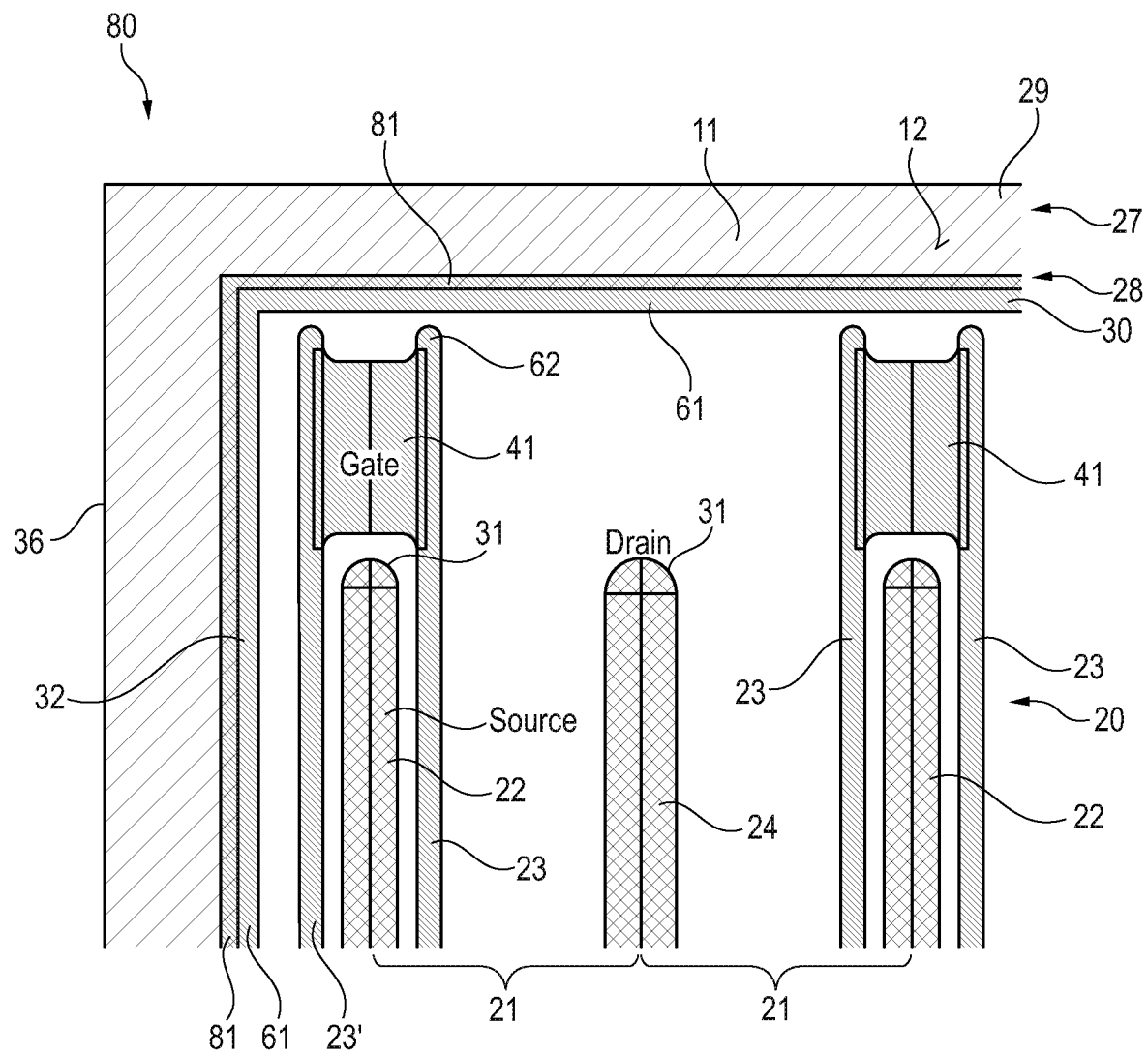
FIG. 6 illustrates a plan view of an enhancement mode Group III nitride-based transistor device according to an embodiment.

FIG. 6 illustrates a plan view of a semiconductor device including an enhancement mode Group III nitride-based transistor 80 having an arrangement similar to that illustrated in FIG. 4. However, in the enhancement mode Group III nitride-based transistor 80, the p-doped Group III nitride runner 30 of the edge termination structure 28 is spaced apart from the first end 31 of the drain finger 24 at its inboard side and overlaps the isolation ring 29 at its outboard side.

In this embodiment, the p-doped Group III nitride runner 30 partially overlaps the isolation ring 29. The outboard edge of the p-doped Group III nitride runner 30 overlaps the isolation ring 29 so that the outboard region 81 of the p-doped group III nitride runner 30 is damaged. The inboard edge of the p-doped Group II nitride runner 30 is positioned inboard of and does not overlap with the isolation ring 29 so that the inboard region of the p-doped Group III nitride runner 30 is undamaged.

In embodiments in which the p-doped Group III nitride runner 30 further includes extensions 32, 33, 34 extending in the longitudinal direction and in the transverse direction that together form a continuous ring 61 surrounding the cell field 20, the outboard portion of the ring 61 and, therefore, the outboard portion of the extensions also overlap with the isolation ring 29 and are locally damaged or implanted. The overlapping region forms a ring 81 of damaged or implanted p-doped Group III nitride material on the first surface 12 of the body 11 that is contiguous with and positioned laterally outboard of a ring 61 of undamaged or unimplanted p-doped Group III nitride material.

In the embodiment illustrated in FIG. 6, the isolation ring 29 is formed by an implanted region that extends to the edge of the body 11. In these embodiments, the overlapping region 81 of the isolation ring 29 and the ring 61 is formed by locally implanting into the outboard region of p-doped Group III nitride runner 30 and the ring 61. However, the inboard region of the p-doped Group III nitride runner 30 extensions 32, 33, 34 forming the ring 61, which faces towards the cell fields 20 and active area of the transistor device 80, is not implanted and remains undamaged so that a reduced drain gate leakage at the interface between the cell field 20 and the edge area 27 is maintained.

Figure 7:
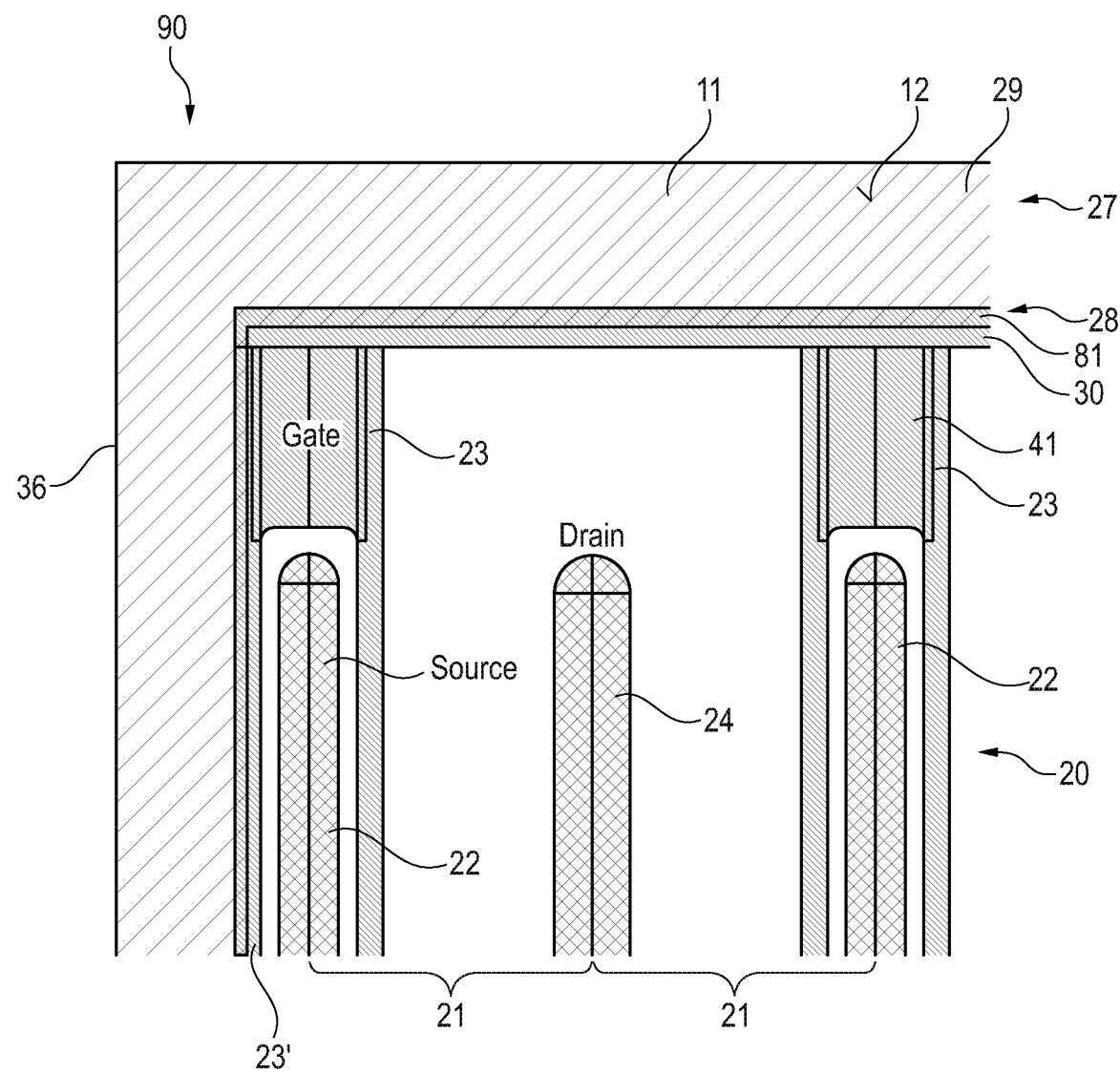
FIG. 7 illustrates a plan view of enhancement mode Group III nitride-based transistor device according to an embodiment.

This overlap between the isolation ring 29 and, in particular, the implanted isolation ring 29 and the p-doped Group III nitride runner 30 can be used for other arrangements of the p-doped Group III nitride runner 30. For example, FIG. 7 illustrates an enhancement mode Group III nitride-based transistor device 90 according to an embodiment in which the p-doped Group III nitride runner 30 is coupled to gate potential and is integral with the gate runners 23, 23', as in the embodiment illustrated in FIGS. 2a-2c and 3a-3c. The edge termination structure 28 of the Group III nitride-based transistor device 90 includes an implanted ring 81. The implanted ring 81 comprises the outboard region of the p-doped Group III nitride runner 30 and the outboard region of the outermost gate finger 23' of the cell field 20, these outboard regions being locally damaged by implantation. The inboard regions of the p-doped Group III nitride runner 30 and inboard region of the outermost gate finger 23' are undamaged and not subjected to implantation.

As mentioned above, the isolation ring 29 may be, but is not limited to, an implanted isolation ring. In some embodiments, the implanted region has a depth from the first surface 12 such that it interrupts, in particular depletes, the two-dimensional carrier gas formed at the interface between the Group III nitride channel region 14 and the Group III nitride barrier region 13 in the edge region 27. The implanted region may have a depth from the first surface 12 into the body 11 which is greater than the depth of the heterojunction 15 formed between the Group III nitride barrier layer 13 and the underlying Group III nitride channel layer 14 from the first surface 12.

In other embodiments, the isolation ring may be formed by a recess which extends from the first surface 12 into the body 11. In some embodiments, the base of this recess may have a depth from the first surface 12 which is greater than the depth of the heterojunction 15 from the first surface 12.

Figure 8:
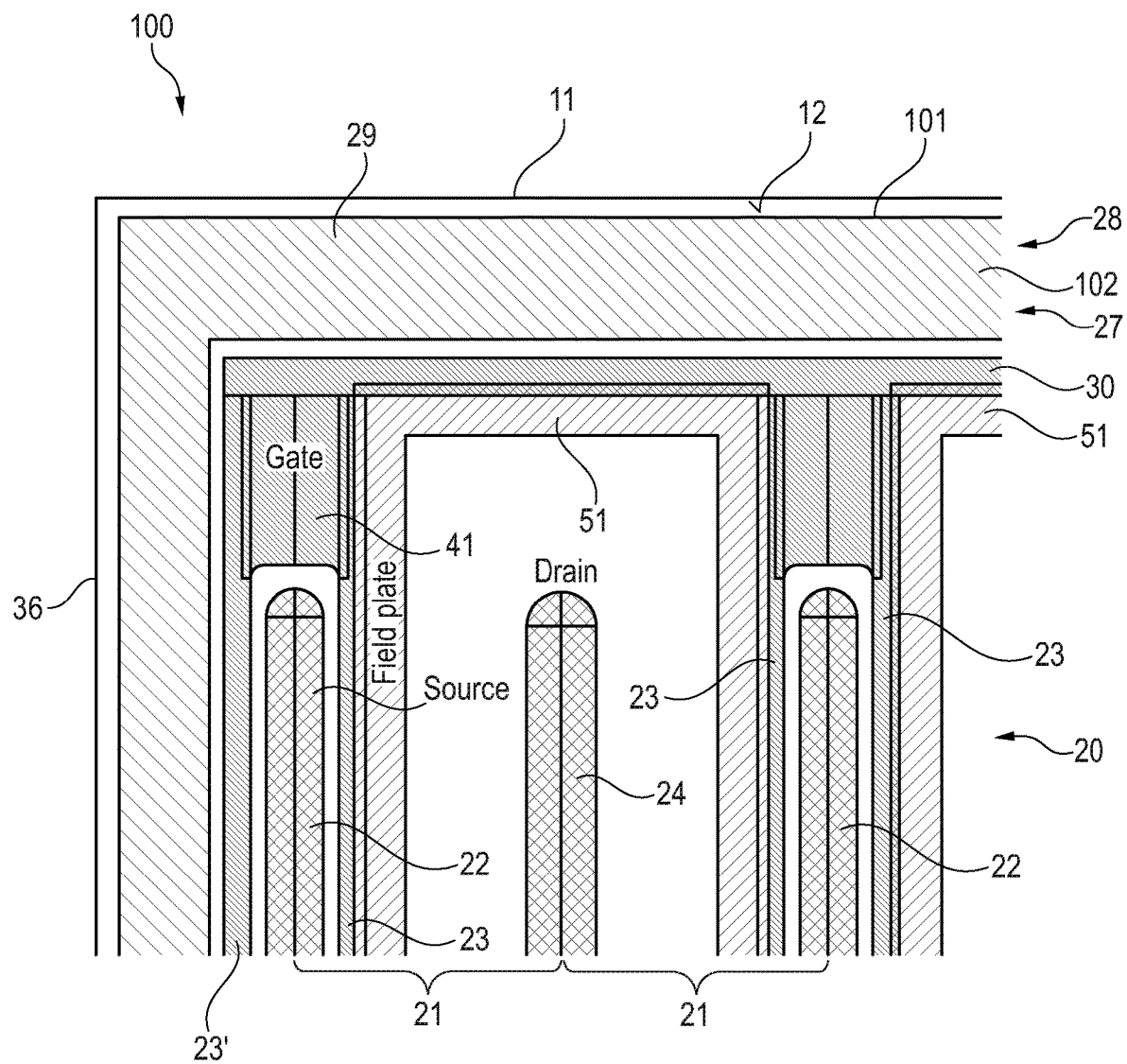
FIG. 8 illustrates a plan view of an enhancement mode Group III nitride-based transistor device including a recessed isolation ring and a field plate.

FIG. 8 illustrates an example of an enhancement mode Group III nitride-based transistor device 100 including an edge termination structure 28 comprising a ring-shaped recess 101 filled with an insulating material 102 which provides the isolation ring 29. The recess 101 has two side walls and a base formed from material of the body 11.

This form of the isolation ring 29 is illustrated in FIG. 8 for the embodiment described with reference to FIG. 3 in which the p-doped Group III nitride runner 30 is integral with the gate fingers 23, 23' and forms a ring around the cell field 20 and a ring around the drain finger 24. This ring is laterally spaced apart from the drain finger 24. The p-doped Group III nitride runner 30, the gate fingers 23, 23' and gate connection 41 also form a ring of p-doped Group III nitride material that is positioned around and laterally spaced part from the source finger 22. The enhancement mode Group III nitride device 100 includes a field plate 51. However, the recess 101 for the isolation ring 29 can be used in place of the damaged implant isolation ring 29 used in any one of the embodiments described herein with reference to FIGS. 1a to 5.

In some non-illustrated embodiments, the recess 101 extends to the peripheral edge of the body 11 so that the body 11 has a stepped upper edge that is filled with insulating material 102.

Figure 9:
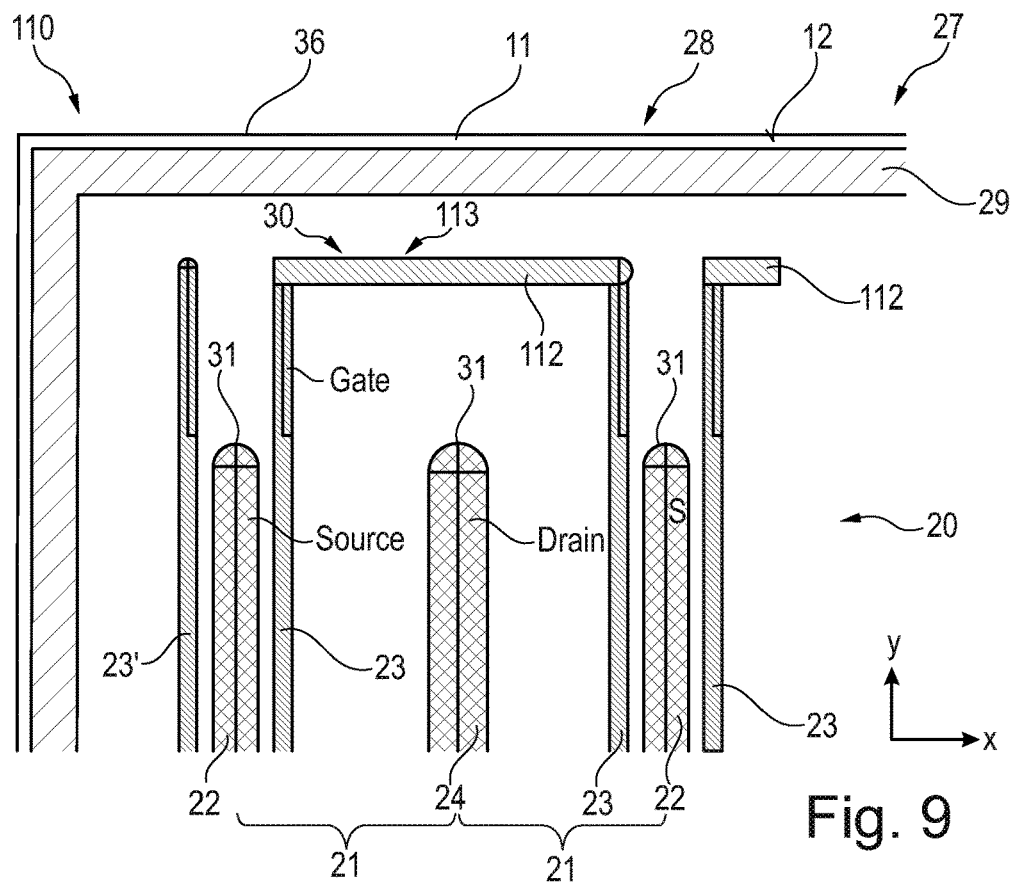
FIG. 9 illustrates a plan view of an enhancement mode Group III nitride-based transistor device according to an embodiment.

FIG. 9 illustrates a plan view of a semiconductor device including an enhancement mode Group III nitride-based transistor device 110 which includes a cell field 20 comprising a plurality of transistor cells 21, each transistor cell comprising a source finger 22, gate finger 23 and a drain finger 24. The enhancement mode Group III nitride-based transistor device 110 also includes an edge region 27 with an isolation ring 29 which surrounds the plurality of transistor cells 21 and which locally interrupts the two-dimensional carrier gas formed the heterojunction 15 in the edge region 27. As in the embodiments illustrated in FIGS. 1a to 7, the isolation ring 29 is formed by a discrete localised region with e.g. a damaged crystal structure. In this embodiment, the isolation ring 29 is spaced at a distance from the peripheral edge 36 of the body 11. However, the isolation ring 29 may extend to the peripheral edge of the body 11 as in the embodiments illustrated in FIGS. 2a to 7. The enhancement mode Group III nitride device 110 further includes a p doped Group III nitride runner 30 which extends transversely to the longitudinal direction and which is positioned on the first surface 12 laterally between the isolation ring 29 and the first end 31 of the drain finger 24. The p-doped Group III nitride runner 30 is spaced apart from the isolation ring 29 and the first end 31 of the drain finger 24.

In this embodiment, the p-doped Group III nitride runner 30 includes a plurality of separate sections 112 that are laterally spaced apart from one another. Each section 112 extends between two gate fingers 23 which are positioned on opposing lateral sides of a drain finger 24.

The distal ends 31 of the source fingers 22 are, in this embodiment, not bounded by the p-doped doped Group III nitride runner in contrast to the embodiment illustrated in FIGS. 2a to 8 in which the p-doped Group III nitride runner 30 extends uninterruptedly along the side of the cell field 20 and is also positioned between the isolation ring 29 and the first end 31 of the source finger 22.

The gate fingers 23 each include a p-doped Group III nitride gate finger 25 and a metallic gate finger 26 positioned on the p-doped Group III nitride gate finger 25 as in the other embodiments. Therefore, the drain finger 24 is entirely laterally surrounded by a continuous ring of p-doped Group III nitride material positioned on the first surface 12.

A further p-doped Group III nitride runner section, that cannot be seen in the view of FIG. 9, extends between the gate electrodes 23 at a position that is adjacent to and spaced apart from the opposing end of the drain finger 24 so that the drain finger 24 is continuously surrounded by a p-doped Group III nitride ring structure 113 formed by the gate fingers 23 and two sections 112 of the p-doped Group III nitride runner 30. Each of the ring structures 113 is laterally separate from the others.

Since the p-doped Group III nitride runner 30 is split into separate sections, a plurality of p-doped Group III nitride rings 113 is positioned adjacent one another in the cell fields 20 with the source fingers 22 being positioned between adjacent p-doped Group III nitride rings 113. In this embodiment, no gate connection region is provided between the gate fingers 23 arranged adjacent opposing lateral sides of the source fingers 22.

In the embodiment illustrated in FIG. 9, the enhancement mode Group III nitride-based transistor device 111 also includes an outermost gate finger 23' which is positioned between the outermost source finger 22 and the isolation ring 29.

Figure 10:
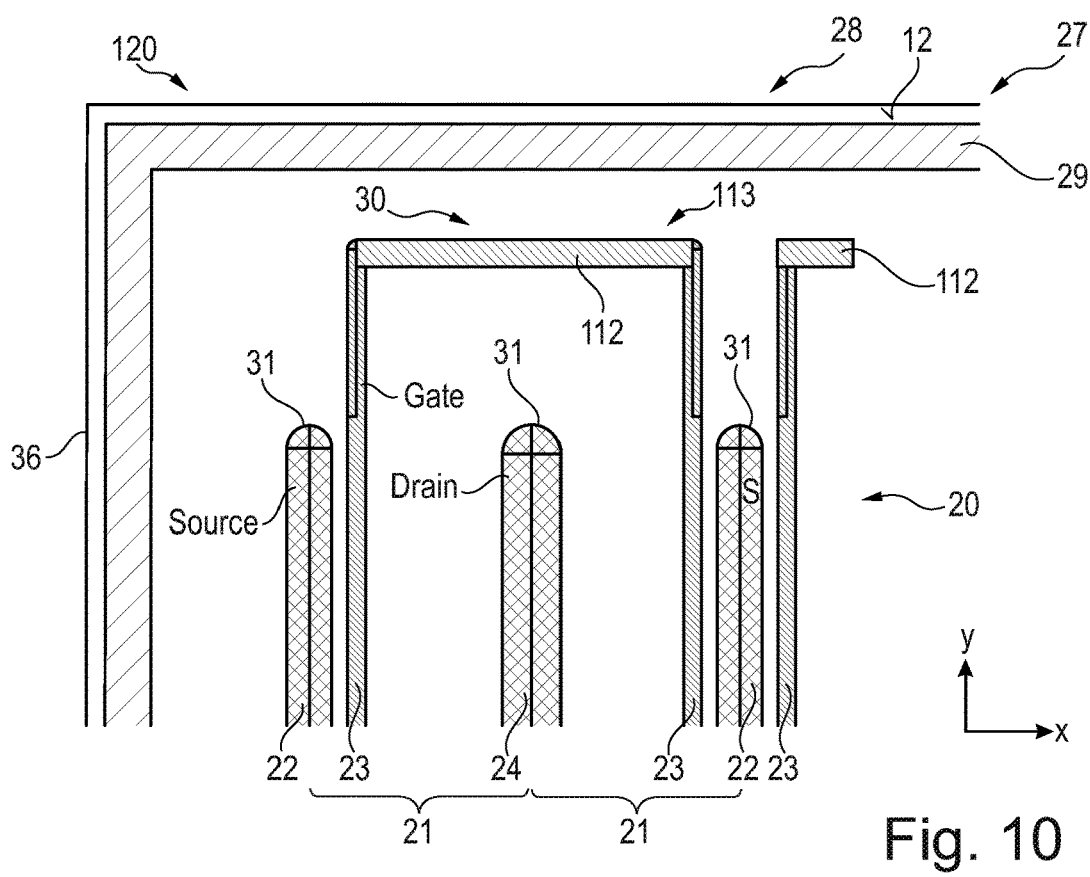
FIG. 10 illustrates a plan view of an enhancement mode Group III nitride-based transistor device according to an embodiment.

In some embodiments, such as that illustrated in FIG. 10, the outermost gate finger 23' of the arrangement illustrated in FIG. 9 can be omitted so that, in the enhancement mode Group III nitride-based transistor 120 illustrated in FIG. 10, the outermost source finger 22 of the cell field 20 is positioned laterally adjacent the isolation ring 29 without a gate finger 23' or other p-doped Group III nitride runner being positioned between the outermost source finger 22 and the isolation ring 29.

Figure 11:
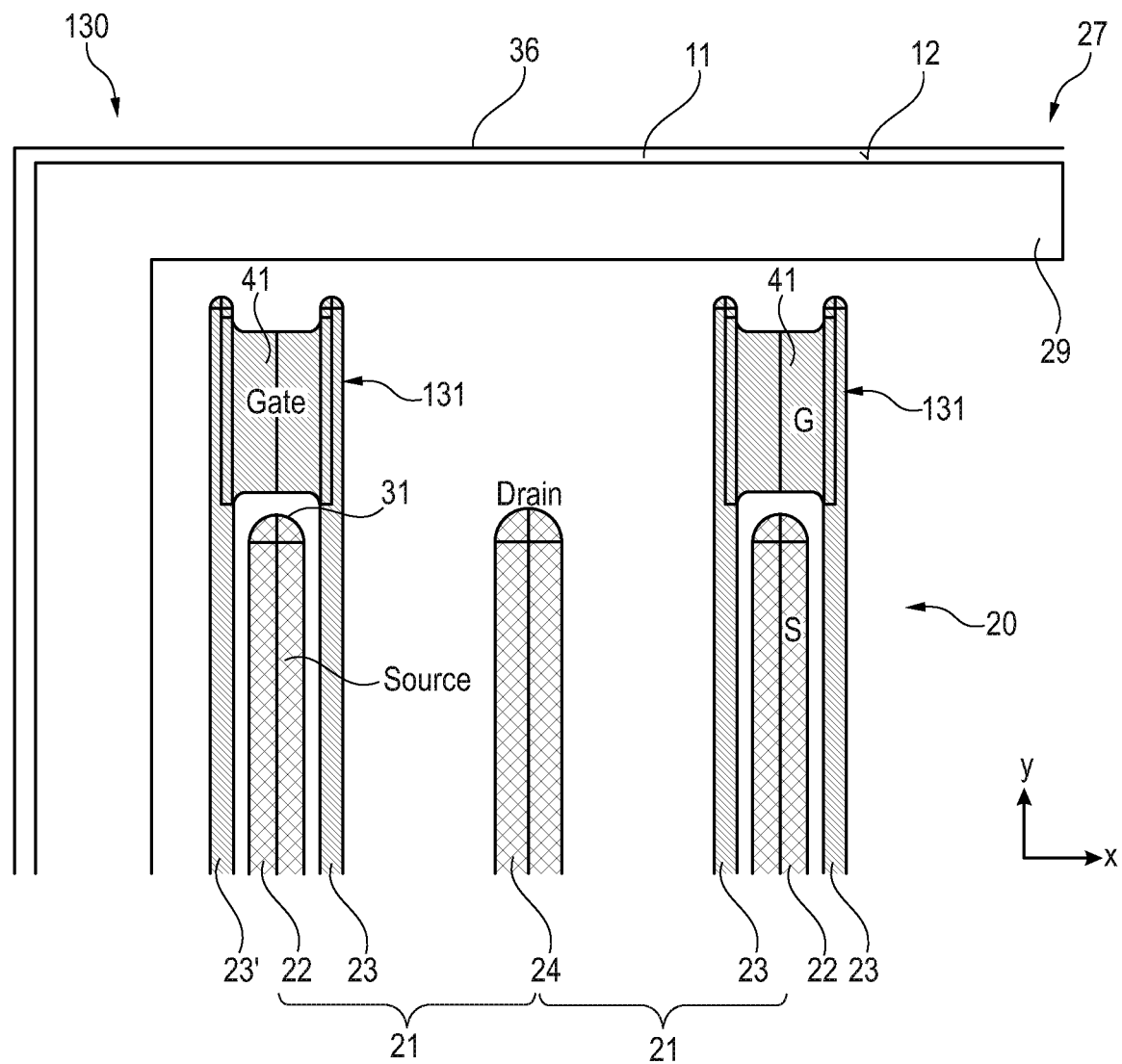
FIG. 11 illustrates a plan view of an enhancement mode Group III nitride-based transistor device according to an embodiment.

FIG. 11 illustrates an alternative embodiment of an enhancement mode Group III nitride transistor 130 device having a body 10 having a first surface 12. The body 11 has a multilayer structure of Group III nitrides and may have the structure as illustrated in the cross-sectional views of FIGS. 1c-1d or any of the embodiments described herein. The enhancement mode Group III nitride-based transistor device 130 includes at least one cell field 20 comprising a plurality of transistor cells 21, each comprising a source finger 22, gate finger 23 and the drain finger 24 that extend substantially parallel to one another on the first surface 12 in the longitudinal direction, which is indicated in the drawings by the direction Y. The enhancement mode Group III nitride transistor device 130 also includes an edge region 27 which includes an isolation ring 29 which uninterruptedly surrounds the transistor cells 21.

In this embodiment, the isolation ring 29 comprises a discrete localised region having a damaged crystal structure that locally interrupts the two-dimensional carrier gas in the edge region 27. The isolation ring 29 may extend to the peripheral edge of the body 11 or, as illustrated in FIG. 11, may be spaced at a distance from the peripheral edge 36 of the body 11.

In some embodiments, the isolation ring 29 comprises a recess that interrupts the heterojunction and, therefore, the two-dimensional carrier gas. In embodiments, in which the isolation ring 29 is provided by a damaged region, for example formed by implant, the heterojunction still is in place but due to the damage to the crystal structure and, if present, implanted ions, the two-dimensional carrier gas (2DEG or 2DHG) cannot form. In depths deeper than the position of the two-dimensional carrier gas, the damaged crystal structure, or implanted ions id present, act as a dopant which prevents lateral conduction.

In the embodiment illustrated in FIG. 11, each of the source fingers 22 is laterally continuously and uninterruptedly surrounded by a ring of p doped Group III nitride material. The gate fingers 23 include a p-doped Group III nitride finger 25 arranged on the first surface 12 and a metallic gate finger arranged on the p-doped Group III nitride finger 25. The gate fingers 23 positioned on opposing lateral sides of each source finger 22 are connected by a gate connection region 41 which is spaced apart from the distal end 31 of the source finger 22

The gate connection region 41 extends in the transverse direction which is indicated in the drawings as the direction X. The gate connection region 41 is integral with the two gate fingers 23. The gate connection region 41 also includes a p-doped Group III nitride layer which is integral with the p-doped Group III nitride gate fingers 25 and a metallic layer which is integral with the gate metallic fingers 26. The two gate fingers 23 extend further towards the isolation ring 29 than the source finger 22 and gate connection region 41 but are laterally spaced apart from the inboard edge of the isolation ring 29 by a distance. The gate connection region 41 is also laterally spaced apart from the inboard edge of the isolation ring 29 by a distance.

The opposing distal end of the gate finger 22 is also bounded by second gate connection region 41 which cannot be seen in the drawings so that the each of the source fingers 22 is laterally uninterruptedly surrounded by a p-doped Group III nitride ring 131. A plurality of separate rings 131 of Group III nitride material, each positioned on the first surface and laterally surrounding a respective source finger 22 are provided. Each ring 131 is entirely undamaged and laterally spaced apart a distance from the isolation ring 29 and the inboard edge of the isolation ring 29.

In the enhancement mode Group III nitride-based transistor 130, an additional p-doped Group III nitride runner which is positioned between the distal end 31 of the drain finger 24 and the isolation ring 29 is not provided. All of the p-doped Group III nitride material which forms the part of the gate fingers 23 and the gate connection regions 41 is, however, spaced at a distance from the isolation ring 29 and includes an undamaged crystal structure. Therefore, for transistor structures including an a Schottky gate, damage to the p-doped Group III nitride gate finger 26 and gate connection region 41 is avoided so that different gate leakage effects, which can occur for Schottky gates including regions of the p-doped Group III nitride material that have a locally damaged crystal structure and other regions that remain undamaged and have an undamaged crystal structure, can be avoided, also for structures in which the isolation ring 29 is formed by a damaged region.

FIGS. 12*a* to 12*g* illustrate plan views and cross-sectional views, respectively, of an enhancement mode Group III nitride-based transistor device with a gate runner.

Figure 12A:
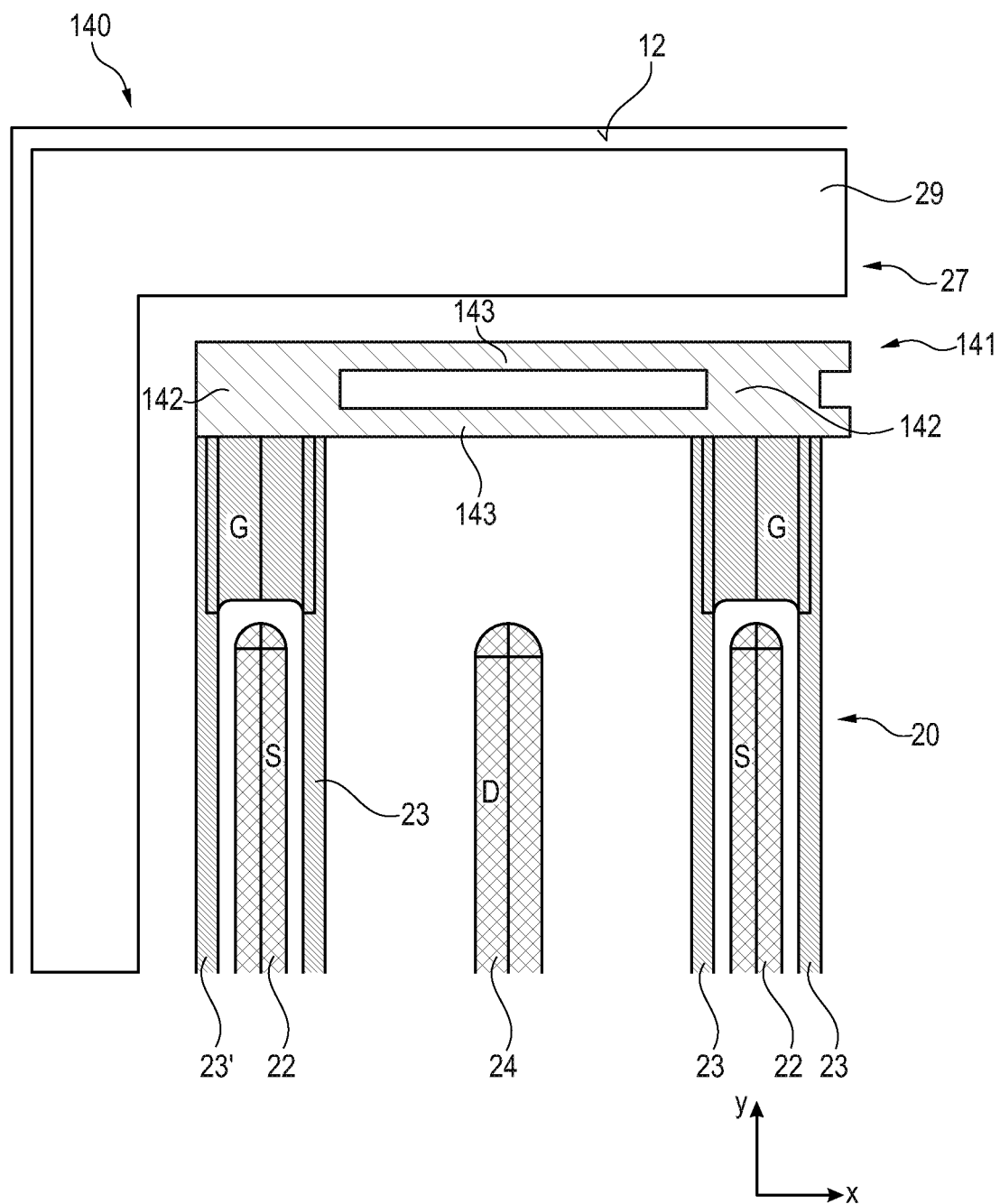
FIGS. 12a to 12g illustrate plan views and cross-sectional views, respectively, of an enhancement mode Group III nitride-based transistor device with a gate runner.

FIG. 12*a* illustrates a plan view of a portion of an enhancement mode Group III nitride-based transistor device 140 which includes a gate runner 141 that is laterally spaced apart from the isolation ring 29 and from the distal end 31 of the drain finger 24. The gate runner 141 extends transversely in the X direction and is positioned on the first surface 12 adjacent one peripheral transverse edge of the cell field 20. The gate runner 141 is positioned laterally between the isolation ring 29 in the edge region 27 and the distal end 31 of the drain finger 24

The gate fingers 23 positioned on opposing lateral sides of a source finger 22 form a pair that are connected by a gate connection region 142 which extends in the longitudinal Y direction from within the cell field 20 to the gate runner 141 in the edge region 27. The gate runner 141 extends in the X direction between the gate connection regions 142 to electrically couple the gate fingers 23 together.

The gate runner 141 comprises a p-doped Group III nitride gate runner and a metallic gate runner positioned on the p-doped Group III nitride runner. The gate runner 141 may be integral with the gate connection region 142 and the gate fingers 23. The p-doped Group III nitride gate fingers 23, the p-doped Group III nitride gate connection region 142 and the p-doped Group III nitride gate runner may be formed using the same masking and processing steps. The metallic gate finger 26, the metallic gate connection region and the metallic gate runner may be formed using the same masking and processing steps.

In some embodiments, the gate runner 141 comprises two transverse p-doped Group III nitride runner sections 143 that are spaced apart from one another in the Y direction and which extend substantially parallel to one another in the X direction and join neighbouring gate connection regions 142 to one another. One or both of these transverse p-doped Group III nitride runner sections 143 may be considered to be formed from the p-doped Group III nitride runner 30.

A further gate metal runner formed in the power metallisation of the transistor device may be positioned above the gate runner 141.

In some embodiments, a gate contact via to the overlying metallic gate runner (not illustrated in FIG. 12*a*) is positioned on the gate connection region 142 and/or on one or both of the transverse p-doped Group III nitride runner sections 143.

Figure 12B:
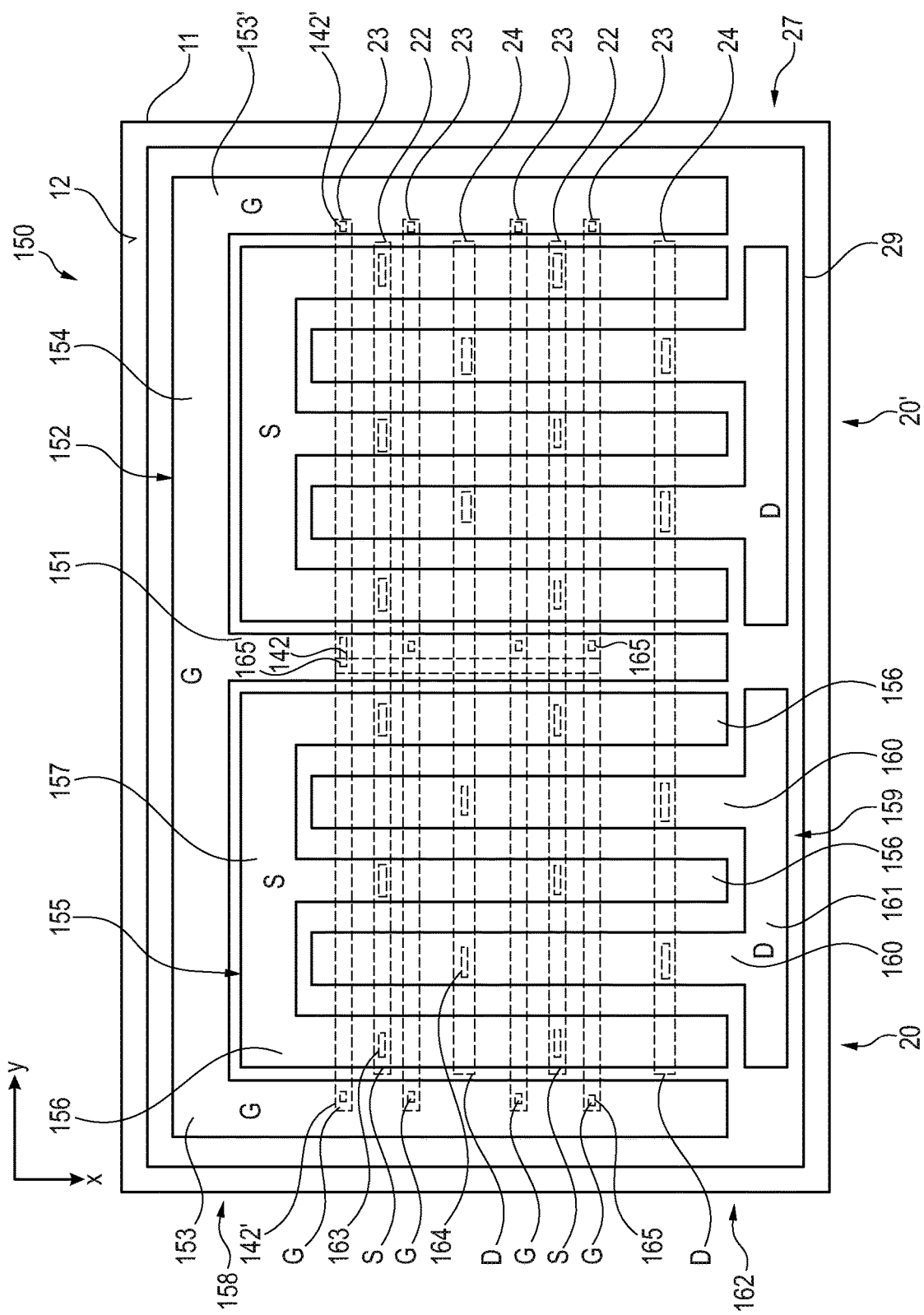

FIG. 12*b* illustrates a plan view of an enhancement mode Group III nitride-based transistor device 150 including two cell fields 20, 20' and a metallic power gate runner 151 that is located laterally between the cell fields 20, 20'. The metallic gate runner 151 extends in the X direction between the adjacent cell fields 20, 20' and perpendicular to the longitudinal direction and length of the source, gate and drain fingers 22, 23, 24. The metallic power gate runner 151 is arranged in the central active region of the device 150 and may be called an internal or in-cell gate runner.

The power gate runner 151 is part of a metallic power gate structure 152 that includes a section 153 that extends in the X direction and is positioned outboard of the first cell field 20 in the edge region 27 and a further section 153' that extends in the X direction is positioned outboard of the first cell field 20' in the edge region 27 on the opposing side of the first surface 12. The metallic gate runners 151, 153, 153' are coupled by a further metallic gate runner 154 that extends in the Y direction in the edge region 27 to form the metallic gate power structure 152.

A single isolation ring 29 laterally surrounds and is spaced apart from the gate runner structure 152 and the gate runner sections 153 and 154.

Each of the first cell field 20 and the second cell field 20' includes a plurality of transistor cells 21, each including a source finger 22, a drain finger 24 and a gate finger 23 positioned laterally between the source finger 22 and the drain finger 24. The source fingers 22, gate fingers 23 and drain fingers 24 are substantially parallel to one another and extend in the Y direction. The longest direction of each of the source fingers 22, gate fingers 23 and drain fingers 24 is substantially perpendicular to the long direction of the metallic gate runners 151, 153, 153'.

Each of the source fingers 22 and drain fingers 24 have a lateral extent such that they are positioned within the cell field 20, 20' and laterally within the metallic gate runners 153, 151 and 151, 153', respectively.

Pairs of gate fingers 23 positioned on opposing sides of a source finger 22 include a gate connection region 142, 142'. The gate extension region 142 that extends from the first cell field 20 to the second cell field 20' and, therefore, in the region between the cell fields such that the gate fingers 23 extend continuously from the first cell field 20 to the second cell field 20' and under the metallic gate runner 151 that is positioned between the cell fields 20; 20'. The gate runner 151 extends in the X direction and perpendicular to the longitudinal direction of the gate fingers 23 and electrically couples the gate fingers 23 to the metallic power gate structure 152.

Additionally, the opposing ends of the pairs of gate fingers 23 positioned on opposing sides of a source finger 22 include the gate connection 142' such that the gate connection regions 142' extend under the metallic gate runner section 153, 153' at the opposing peripheral edges of the cell fields 20, 20'.

The gate connection regions 142, 142' are connected by one or more p-doped Group III nitride runners 143 that are positioned under the metallic gate runners 151, 152, 153 and extend in the X direction and substantially perpendicularly to the length of the gate runners 23. If two gate p-doped group III nitride runners 143 are provided, these are spaced apart from another in the Y direction.

The enhancement mode Group III nitride transistor device 150 further includes a metallic source structure 155 which includes a plurality of first elongate sections 156 which extend in the X direction and, therefore, perpendicularly to the long length of the source fingers 22. Each of the elongate sections 156 of the metallic source structure 155 is electrically coupled together by a further section 157 which extends in the Y direction and is positioned on a first side 158 of the cell field 20. The section 157 of the metallic source structure 155 is arranged laterally between and spaced laterally part from the gate runner 154 and the cell field 20. Each of the cell fields 20, 20' includes a separate metallic source structure 155.

The enhancement mode Group III nitride transistor device 150 further includes a metallic drain structure 159 which includes a plurality of second elongate sections 160 which extend in the X direction and, therefore, substantially perpendicular to the longitudinal direction of the drain fingers 24. The plurality of second elongate sections 160 are electrically coupled together by a further section 161 which extends in the Y direction and is positioned adjacent a second side 162 of the cell field 20 that opposes the first side 158 of the cell field 20. The first elongate sections 156, which are electrically coupled to source, are interleaved with the second elongate sections 160, which are coupled to drain, so that an alternating source, drain, source drain, structure is provided within the cell field 20.

The metallic source structure 155, metallic drain structure 159 and the metallic gate structure 152 are positioned in a plane above and vertically spaced apart from the source fingers 22, gate fingers 23, drain fingers 24 and the p-doped Group III nitride runners 143 and gate connection extensions 142 by one or more intervening insulating layers.

The source fingers 22 are electrically coupled to the first elongate sections 156 by a plurality of conductive vias 163 which extend between the source fingers 22 and the overlying first elongate sections 156. Each source finger 22 is, therefore, electrically coupled to each section 156 of the source metallisation structure 55 at a plurality of regions. Similarly, the drain fingers 24 are electrically coupled to the overlying second elongate sections 160 of the metallic drain structure 159 by a plurality of conductive vias 164 which extend between the drain finger 24 and the overlying second elongate section 160. The first conductive vias 163 are offset in the X direction from the second conductive vias 164 due to the arrangement of the source fingers 22 and drain fingers 24 and the overlying first sections 156 and second sections 160.

Figure 12C:
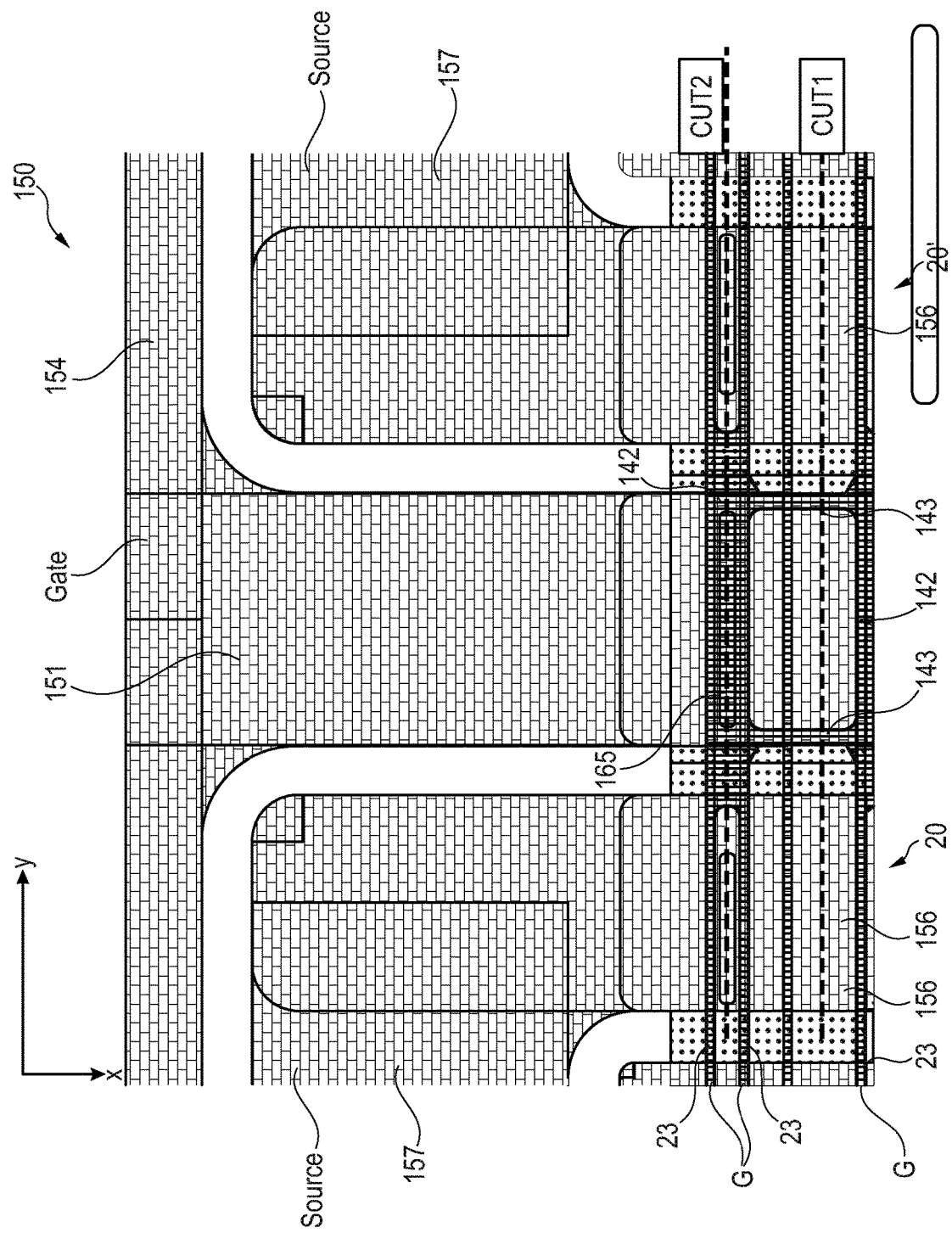
Figure 12D:
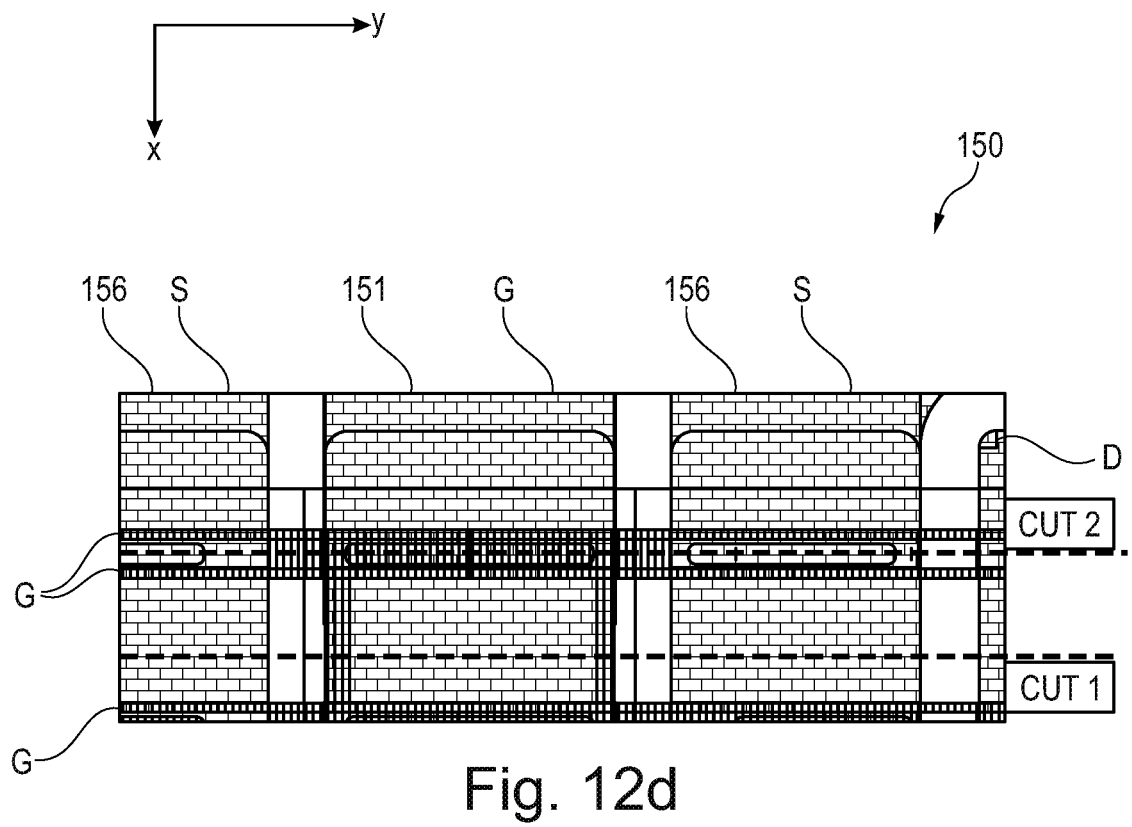
Figure 12E:
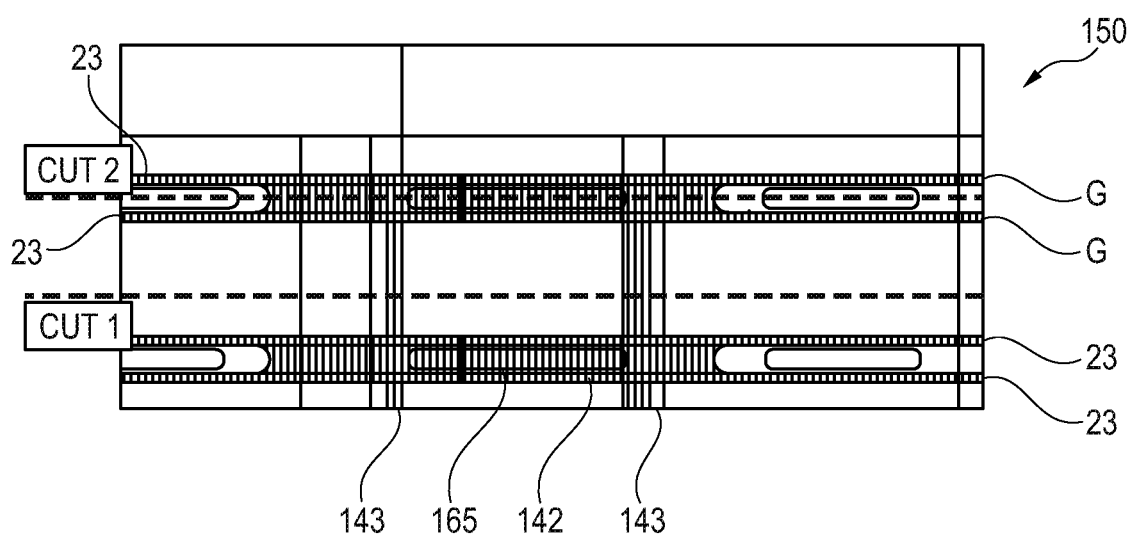
Figure 12F:
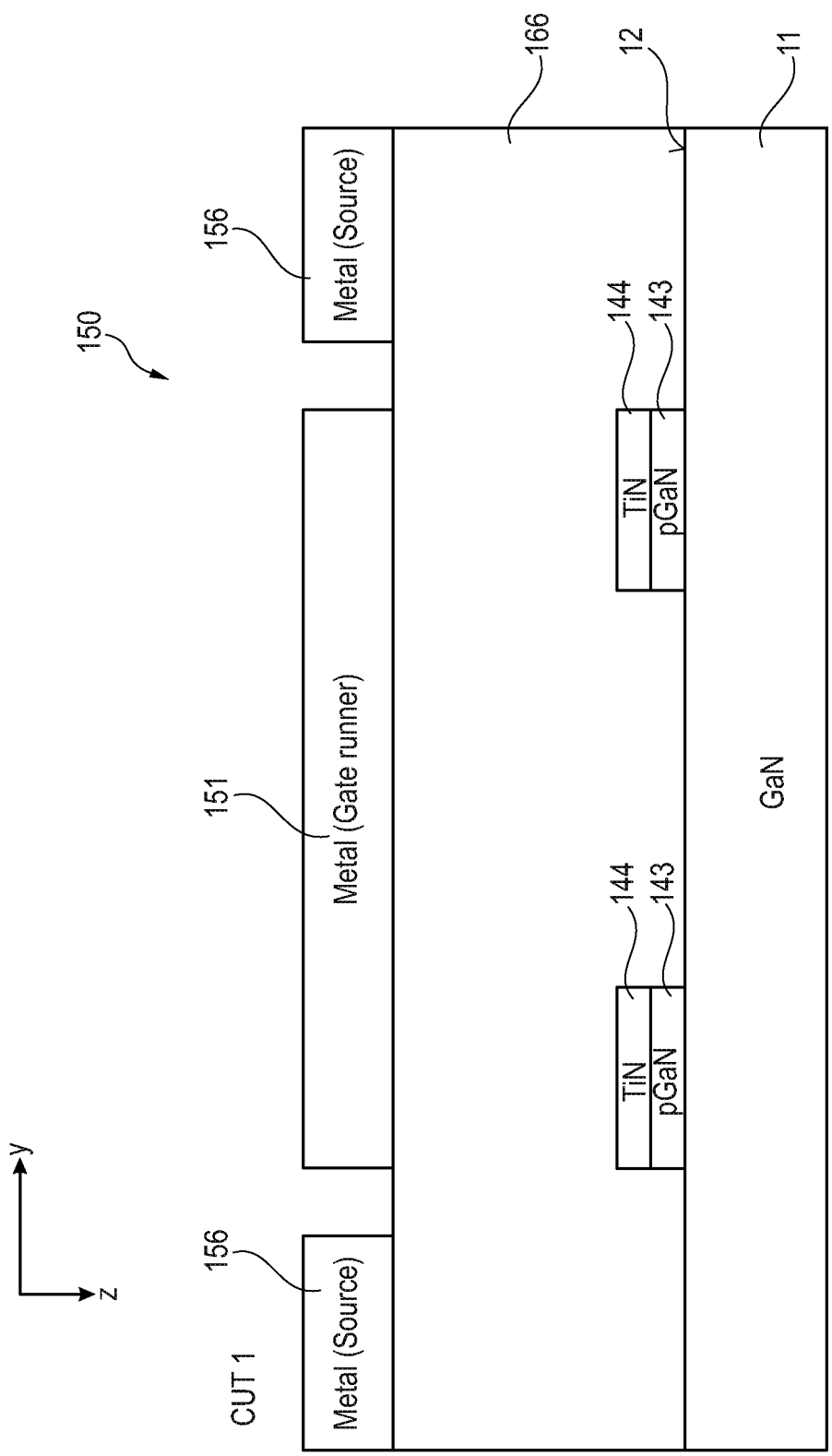
Figure 12G:
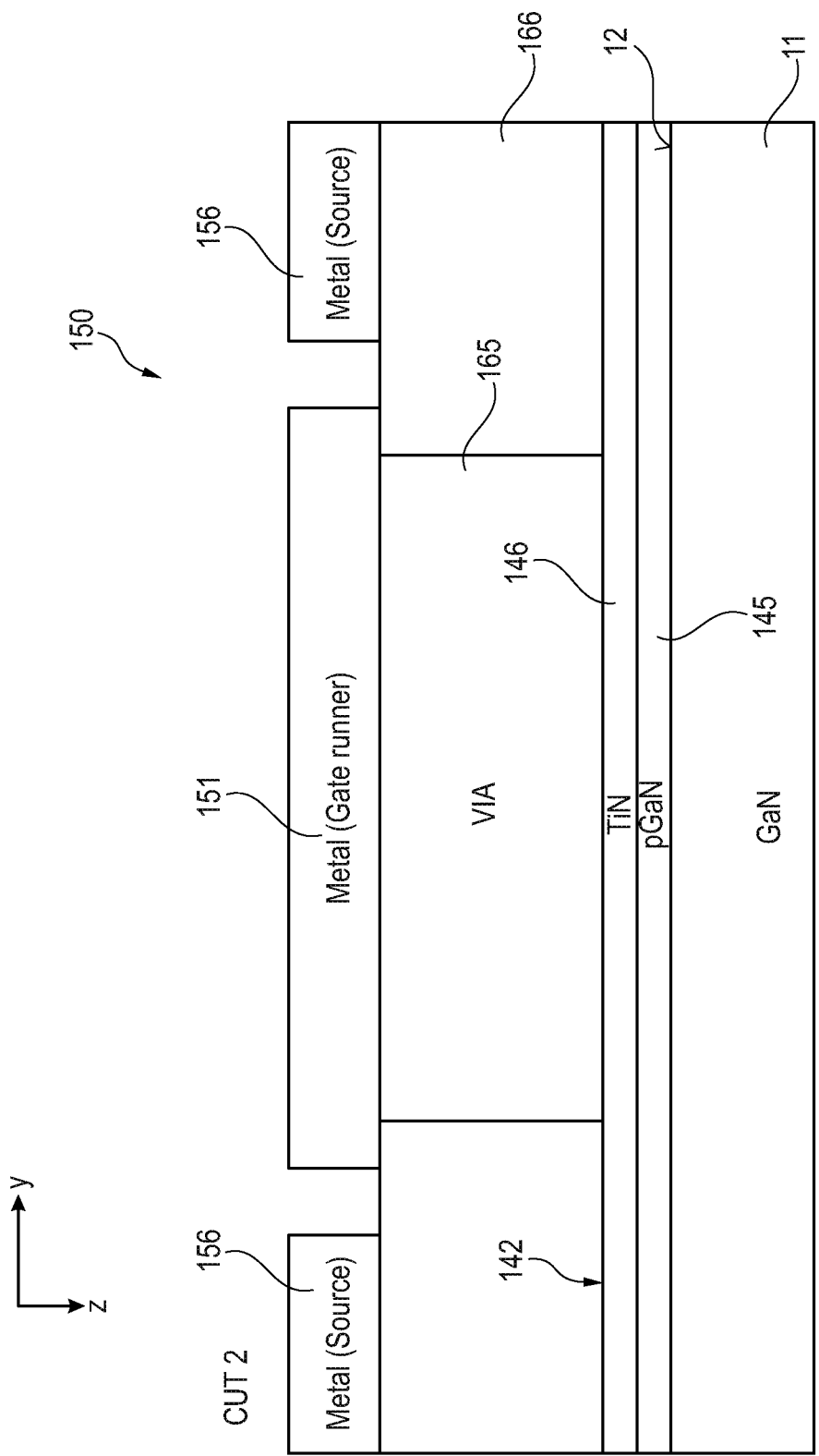

The gate fingers 23 are also electrically coupled to the overlying metallic gate structure 152 which is described in with reference to enlarged plan views of FIGS. 12c, 12d and 12e and the cross-sectional views of FIGS. 12f and 12g.

FIG. 12c illustrates a plan view of a portion of the gate runner 151 positioned between two cell fields 20, 20'. FIG. 12d illustrates a further enlarged view of the metallic gate runner 151 and metallic source structure 155 and underlying gate fingers 23 and FIG. 12e illustrates an enlarged view of the underlying gate fingers 23 without showing the overlying metallic gate runner and metallic source structure. FIG. 12f illustrates a cross-sectional view along the line CUT 1 indicated in FIGS. 12c to 12e and FIG. 12g illustrates a cross-sectional view along the line CUT 2 indicated in FIGS. 12c to 12e.

As discussed above, the gate fingers 23 positioned on two laterally opposing sides of a respective source finger 22 are electrically connected to one another by a gate connection region 142 which extends between the two cell fields 20, 20' so that the gate fingers 23 extend continuously and uninterruptedly between the two cell fields 20, 20' and under the metallic gate runner 151. The gate connection regions 142 which extend between the pairs of gate fingers 23 are spaced apart from one another in the X direction and are electrically coupled to one another by one or more p-doped Group III nitride runners 143 that extend in the X direction.

In the embodiment illustrated in FIGS. 12a to 12g, two p-doped Group III nitride runners 143 are provided which are spaced apart a distance from the distal end 31 of the drain runner 24 positioned in the adjacent cell fields 20, 20'. The gate fingers 23 are electrically coupled to the overlying metallic gate finger 153 by a conductive via 165 which extends between the gate connection region 142 and the overlying metallic gate finger 151. In some embodiments, the via 165 may be positioned so as to extend between the p-doped Group III nitride runner 143 and the overlying metallic gate runner 151. The via 165 may have an elongate structure and extend over the majority of the width of the elongate metallic gate runner 151 in the Y direction.

A gate conductive via 165 may be arranged at each opposing end of the gate fingers 23 such that is extends between the gate connection region 142' and the gate runners 153, 153' at two opposing lateral sides of the first surface 12 and between the gate connection region 142 and the gate runner 151 between the two cell fields 20, 20'.

As can be seen in the cross-sectional view of FIG. 12*f*, the p-doped Group III nitride runner 143 further comprises a metallic runner 144 positioned on the p-doped Group III nitride runner 143. The p-doped Group III nitride runner 143 may be formed using the same process steps and integral with the p-doped Group III nitride gate finger 25 and the metallic runner 144 may be formed using the same process steps and integral with the metallic gate finger 26. The metallic runner 144 may comprise TiN and form a Schottky contact.

As can be seen in the cross-sectional view of FIG. 12*g*, the gate connection region 142 also includes a p-doped Group III nitride layer 145 and a overlying metallic layer 146 which may be integral with the p-doped Group III nitride layer 25 and metallic layer 26 of the gate finger 23 and with the p-doped Group III nitride runner 143 and metallic runner 144, respectively.

Each of the gate fingers 23 includes a p-doped Group III nitride finger 25 and a metallic Group III nitride finger 26 on top of the p-doped Group III nitride finger 25. Similarly, the gate connection regions 142 include a p-doped Group III nitride gate connection region with a metallic gate connection region on top. A metallic transverse runner is also positioned on the transverse p-doped Group III nitride runner 143.

The metallic layer 26 is, in this embodiment, formed from titanium nitride so as to provide a Schottky gate. However, in other embodiments, a different metal may be selected for the metallic layer 26 in order to form a Schottky contact. In other embodiments, a suitable metal may be selected for the metallic layer 26 in order to form an ohmic gate.

An insulating layer 166 is positioned on the first surface 12 of the body 11 of the Group III nitride-based transistor device and covers the metallic layer 26. The elongate sections 156 of the metallic source structure 155 and the metallic gate runner 151 are positioned on the insulating layer 166 and the gate conductive via 165 extends in the Z direction from the metallic layer 26 of the gate connection region 142 to the metallic gate runner 151. The overlying metallic sections 156 that are coupled to the source fingers 22 are electrically isolated from the underlying gate finger 23 by the intervening insulating layer 166.

In the region indicated in the cross-sectional view along line CUT 1 illustrated in FIG. 12*f*, the overlying metal gate runner 151 is spaced apart from the underlying p-doped Group III nitride runner 143 by an intervening portion of the insulating layer 166. The p-doped Group III nitride runner may further include a metallic layer that is formed from the metallic layer 26 of the gate fingers 23 and gate connection regions 142, as can be seen in the cross-sectional view of FIG. 12*f*.

FIG. 12*g* illustrates a cross-sectional view long the line CUT2 and illustrates a cross-sectional view of the gate connection region 142 at a position between the cell fields 20, 20' and illustrates that the gate connection region 142 extends continuously from the first cell field 20 to the second cell field 20'. FIG. 12*g* illustrates that the gate connection region 142 extends under the metallic gate runner 151 and is electrically connected to the metallic gate runner 151 by a gate conductive via 165 which extends between the metallic gate connection region and the metallic gate runner 151. The gate connection region 142 extends under and is electrically insulated from the metal sections 156 of the source metal 155 of both the first cell field 20 and the second cell field 20' by the intervening insulation layer 166.

A contact via 165 is typically provided for each pair of gate fingers 23, i.e. for each gate connection region 142.

In embodiments in which the gate fingers 23 and the transverse p-doped Group III nitride runner 143 are integral so that the p-doped Group III nitride runner 143 is electrically coupled to gate potential, a gate contact in the form of a conductive via, e.g. the elongate conductive via 165, may be positioned on the transverse p-doped Group III nitride runner 143 and extend to the metallic gate runner 151 to electrically couple the gate fingers 23 to the metallic gate runner structure 152 in place of or in addition to a gate via positioned on the gate connection region 142.

Figure 13A:
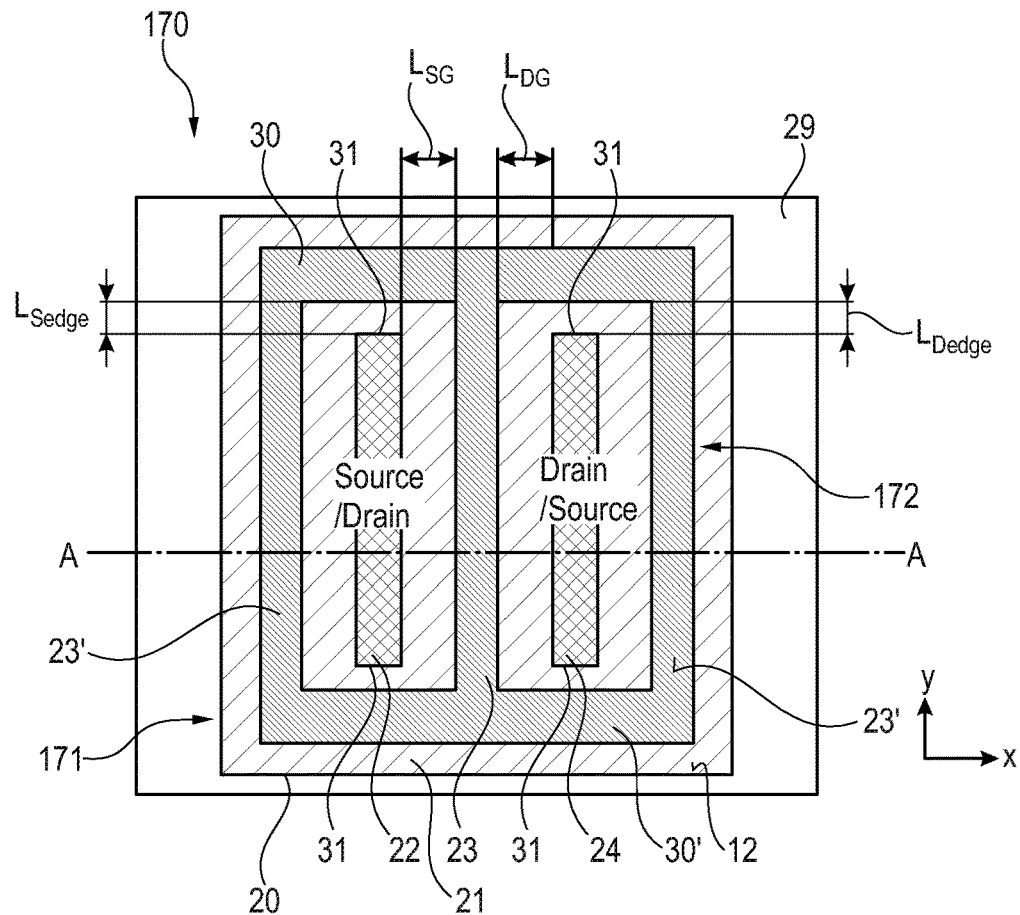
FIGS. 13a and 13b illustrate a plan view and a cross-sectional view, respectively, of an enhancement mode Group III nitride-based transistor device.
Figure 13B:
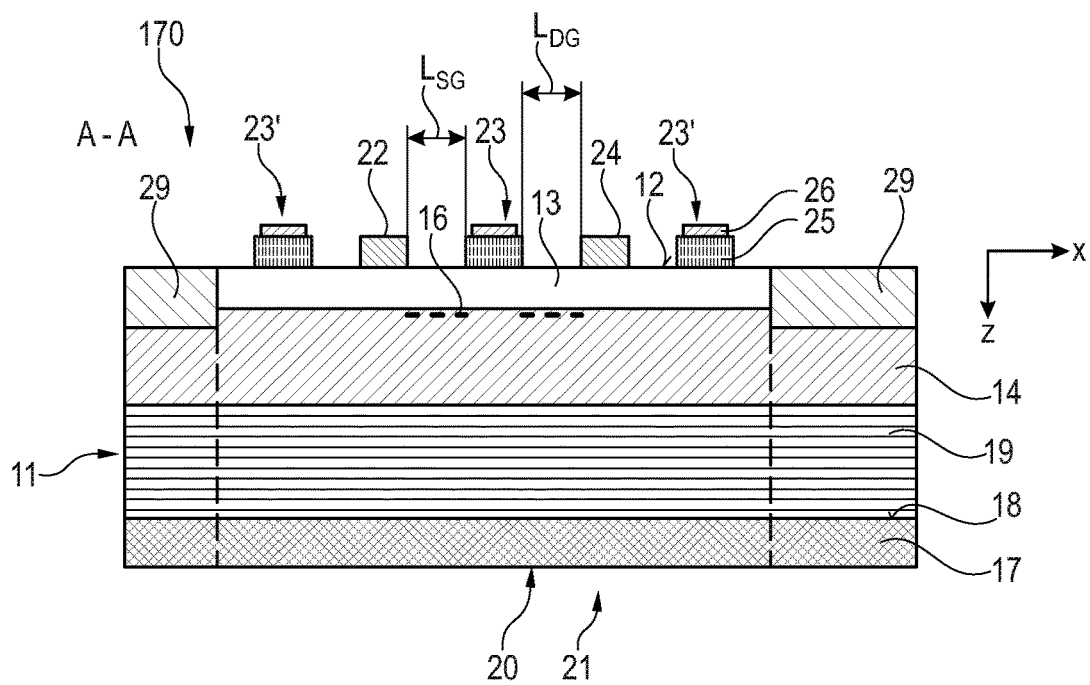

FIGS. 13*a* and 13*b* illustrate a plan view and a cross-sectional view along the line A-A of FIG. 13*a*, respectively, of an enhancement mode Group III nitride-based transistor device 170.

In FIGS. 13*a* and 13*b*, a single cell 21 of the cell field 20 is illustrated. The cell 21 includes a source finger 22, a gate finger 23 and drain finger 24 that extend substantially parallel to one another in the Y direction. The gate finger 23 is positioned laterally in the X direction between the source finger 22 and the drain finger 24. An edge gate finger 23' is positioned on and spaced apart from the opposing side of the source finger 22 and a further edge gate finger 23" is positioned on the opposing side and spaced apart from the drain finger 24. The gate fingers 23', 23, 23" and in particular the p-doped Group III nitride layer 25 of the gate fingers 23', 23, 23" are connected together by the p-doped Group III nitride runners 30; 30' extending in the X direction such that the source finger 22 is laterally continuously and uninterrupted surrounded on all sides by a ring 171 formed from p-doped Group III nitride material of the gate fingers 23', 23 and p-doped Group III nitride runners 30, 30' and the drain finger 24 is laterally continuously and uninterrupted surrounded on all sides by a ring 172 formed from p-doped Group III nitride material of the gate fingers 23, 23" and p-doped Group III nitride runners 30, 30'. These rings 171 and 172 are spaced apart from the isolation ring 29 by a portion of the cell field 20. Both of the opposing distal ends 31 of the drain finger 24 and the opposing distal ends 31 of the source finger 22 are spaced apart from the gate runners 30, 30' by a distance $L_{Sedge}$, $L_{Dedge}$ respectively. These distances $L_{Sedge}$ and $L_{Dedge}$ may be substantially the same.

An asymmetrical arrangement, in which the distance between the source finger 12 and the gate finger 23 $L_{SG}$ is less than the distance between the gate finger 23 and the drain finger 24, $L_{DG}$, as illustrated in FIGS. 1*a* to 12*g* may be used for high voltage devices.

A symmetrical arrangement in which the distance between the source finger 12 and the gate finger 23 $L_{SG}$ is substantially the same as the distance between the gate finger 23 and the drain finger 24, $L_{DG}$, may also be used in place of the asymmetrical arrangement in the embodiments described with reference to FIGS. 1*a* to 12*g*.

In contrast to the embodiments illustrated in FIGS. 1*a* to 12*g*, the distance between the source finger 12 and the gate 23 finger, $L_{SG}$, is substantially the same as the distance between the gate finger 23 and the drain finger 24, $L_{DG}$. The enhancement mode Group III nitride-based transistor device 170 can be considered to have a mirror symmetrical structure about a centre plane of the gate finger 23 that extends in the Y direction. This arrangement of symmetrically arranged source and drain fingers 22, 24 about the gate finger 23 may be used for low-voltage devices and for bidirectional devices in which the blocking voltage in each direction is substantially the same. Therefore, in the enhancement mode Group III nitride device 170, the source finger 22 may equally serve as the drain finger 24 and the drain finger 24 may equally serve as the source finger 22.

In the embodiment illustrated in FIGS. 13a and 13b, a gate structure is formed by the gate fingers 23, 23', 23" extending in the longitudinal or Y direction and the p-doped Group III nitride runners 30, 30' extending in the transverse or X direction to from the two rings 171, 172 that is positioned entirely within the active cell field 20. The isolation ring 29 is spaced apart from the edge gate fingers 23', 23" and from the gate runners 30 and 30' by a portion of the active region 20. The gates 23, 23', 23" include a p-doped Group III nitride layer 25 and a metallic gate 26 positioned on the p-doped Group III nitride layer 25. A metallic layer may also be positioned on the p-doped Group III nitride runners 30, 30' that forms two ring structures on the p-doped Group III nitride rings 171, 172.

Figure 14A:
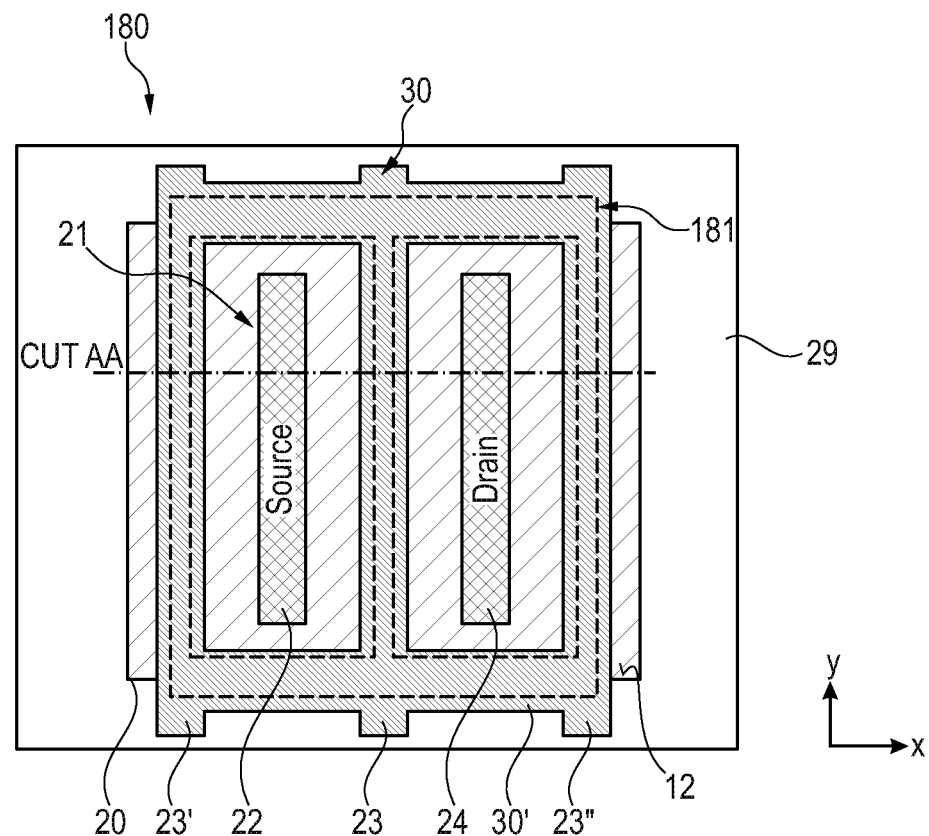
FIGS. 14a and 14b illustrate a plan view and a cross-sectional view, respectively, of an enhancement mode Group III nitride-based transistor device with a recessed gate.
Figure 14B:
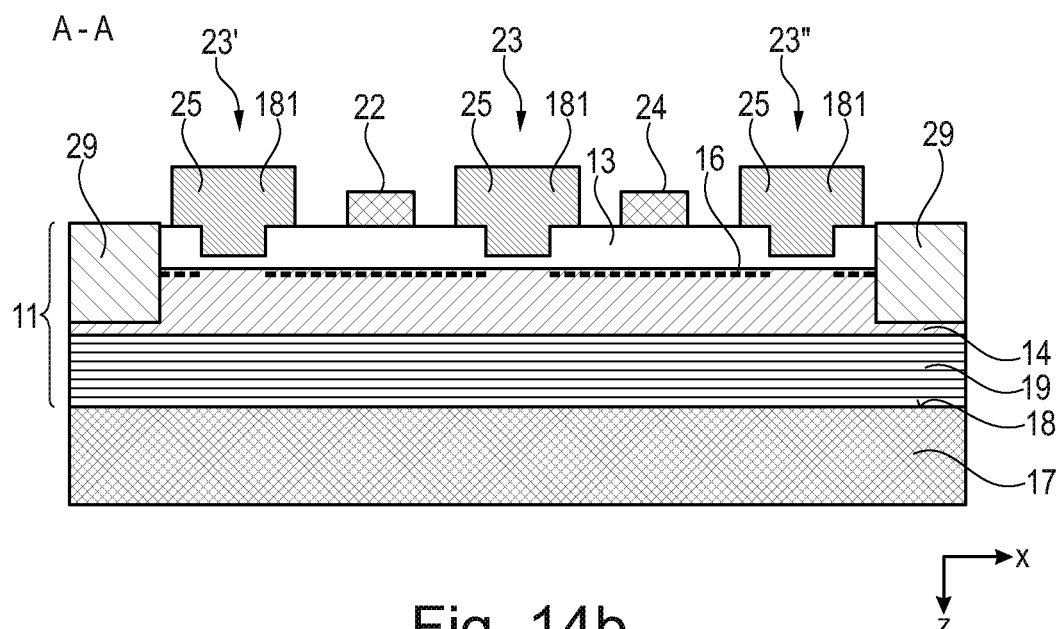

FIGS. 14a and 14b illustrate a plan view and a cross-sectional view along the line A-A of FIG. 14a, respectively, of an enhancement mode Group III nitride-based transistor device 180 with a recessed gate structure 181. In the embodiments illustrated in FIGS. 1a to 13b, the gate finger 23 and the p-doped Group III nitride layer 25 is positioned on the upper surface 12 of the barrier layer 13 such that the interface between the p-doped Group III nitride material 25 and the underlying barrier layer 13 is planar.

In some embodiments, a recessed gate structure 181 can be used, as illustrated in FIG. 14b, in which a recess 182 is positioned in the barrier layer 13. The p-doped Group III nitride layer 25 is positioned in the recess 182 and extends onto the upper surface 12 such that the p-doped Group III nitride layer 25 has a T-shaped form in cross-sectional view. The base of the recess 182 may be formed by the barrier layer 13. FIGS. 14a and 14b illustrate an embodiment with a symmetrical arrangement of the source finger 22 and drain finger 24 about the gate finger 23. However, an asymmetrical arrangement of the source finger 22 and drain finger 23 so that $L_{SG}<L_{DG}$ may also be used for a recessed gate structure.

In the embodiment illustrated in FIGS. 14a and 14b, the gate structure laterally surrounds the source finger 22 and the drain finger 24. The edge gate fingers 23', 23" are positioned on the active area of the cell field 20. The gate runners 30, 30' are however positioned above both the active area, i.e. the cell field 20, and the isolation region 29.

A recessed gate structure 181 can be used for the asymmetrical arrangement illustrated in FIGS. 1a to 12g and for an arrangement as illustrated in FIGS. 13a and 13b, in which the gate structure is positioned entirely within the lateral area of the cell field 20.

Figure 15A:
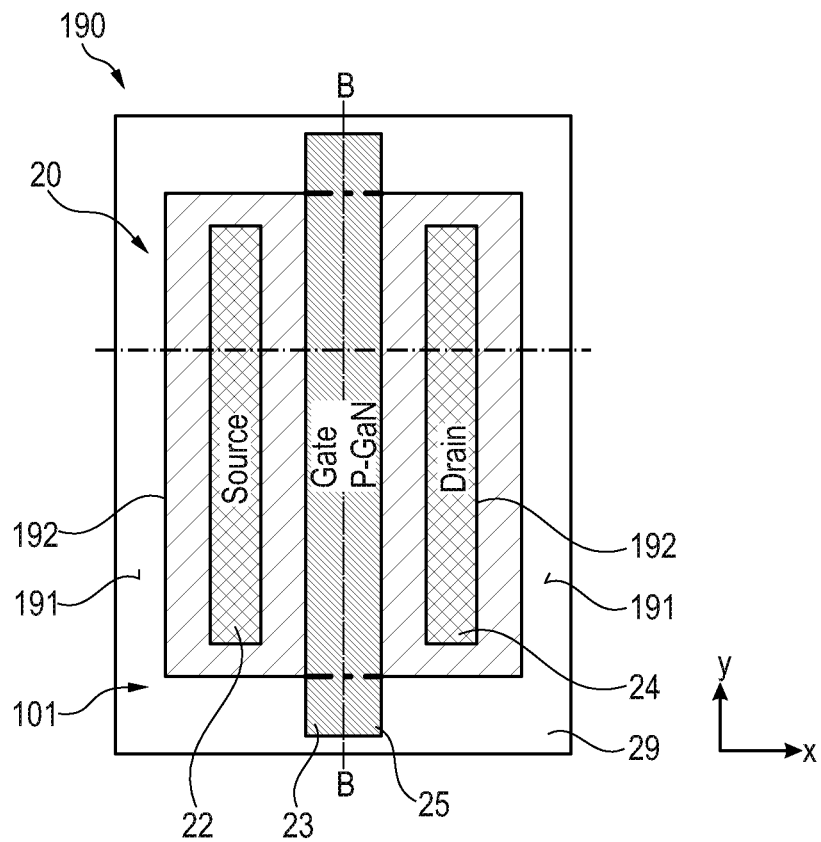
FIGS. 15a and 15b illustrate a plan view and a cross-sectional view, respectively, of an enhancement mode Group III nitride-based transistor device with an isolation ring comprising a recess.
Figure 15B:
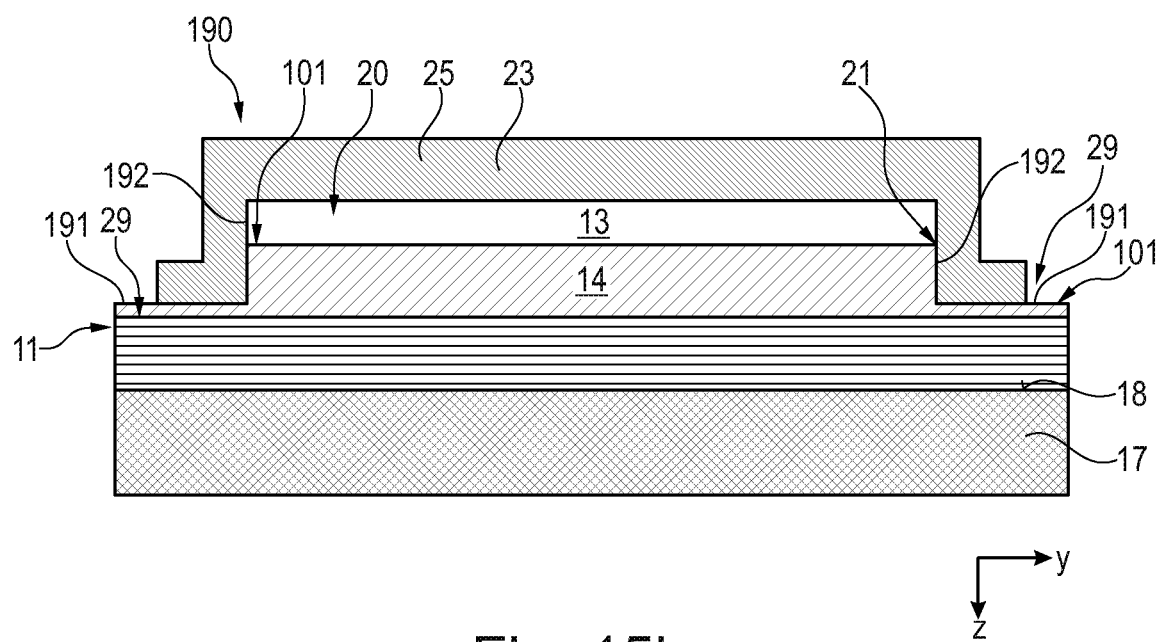

FIGS. 15a and 15b illustrate a plan view and a cross-sectional view along the line B-B of FIG. 15a, respectively, of an enhancement mode Group III nitride-based transistor device 190 with an isolated region 29 comprising a recess 101. The recess 101 has a base 191 that is positioned at a depth from the first surface 12 of the Group III nitride base body 11 so as to locally interrupt the heterojunction and the two-dimensional carrier gas. In some embodiments, the base 191 of the recess 101 has a depth from the first surface 12 that is at least as great as the depth of the heterojunction from the first surface 12 so as to locally interrupt the two-dimensional carrier gas formed at the heterojunction between the channel layer 14 and barrier layer 13.

In the embodiment illustrated in FIGS. 15a and 15b, the recess 101 remains unfilled such that the side faces of the barrier layer 13 and at least a portion of the channel layer 14 form a side face 192 of the recess 101. In some embodiments, such as that illustrated in FIGS. 15a and 15b, the p-doped Group III nitride layer 25 of the gate finger 23 and p-doped Group III nitride runner 30 may extend onto the side faces 192 and onto the base 191 of the recess 101. The p-doped Group III nitride layer 25 of the gate finger 23 is positioned on at least a portion of the inboard side face 192 of the recess 101 and optionally on at least a portion of the base 191 of the recess 101.

The cell field 20 can be considered to have a raised form and protrude from the underlying portion of the body 11. In some embodiments, the p-doped Group III nitride runner 30 may extend onto the side faces 192 and onto the base 191 of the recess 101.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An enhancement mode Group III nitride-based transistor device, comprising:
    a body comprising a first surface, the body further comprising a Group III nitride barrier layer arranged on a Group III nitride channel layer and forming a heterojunction therebetween capable of supporting a two-dimensional carrier gas;
    a first cell field comprising plurality of transistor cells, each transistor cell comprising a source finger, a gate finger and a drain finger that extend substantially parallel to one another on the first surface and in a longitudinal direction, the gate finger being arranged laterally between the source finger and the drain finger and comprising a p-doped Group III nitride finger arranged between a metallic gate finger and the first surface;
    an edge region surrounding the plurality of transistor cells and comprising an edge termination structure, wherein the edge termination structure comprises an isolation ring that locally interrupts the two-dimensional carrier gas;
    a gate runner extending transversely to the longitudinal direction and comprising a plurality of separate sections that are laterally spaced apart from one another, wherein each section of the gate runner is coupled to and extends between two gate fingers which are positioned on opposing lateral sides of the drain finger; and a power gate runner above the gate runner and extending transversely to the longitudinal direction, wherein the gate runner is electrically coupled to the power gate runner by at least one gate contact via.

2. The enhancement mode Group III nitride-based transistor device of claim 1, wherein the metallic gate finger forms a Schottky contact to the p-doped Group III nitride finger.

3. The enhancement mode Group III nitride-based transistor device of claim 1, wherein the isolation ring comprises an implantation region having a depth so as to locally interrupt the two-dimensional carrier gas.

4. The enhancement mode Group III nitride-based transistor device of claim 1, wherein the gate runner comprises a p-doped Group III nitride gate runner arranged on the first surface and a metallic gate runner arranged on the p-doped Group III nitride gate runner, wherein gate fingers positioned on opposing lateral sides of a respective source finger are coupled by a gate connection region of the gate runner, the gate connection region comprising a p-doped Group III nitride gate connection region arranged on the first surface and a metallic gate connection region arranged on the Group III nitride gate connection region, and wherein the gate connection regions are coupled by the p-doped Group III nitride gate runner.

5. The enhancement mode Group III nitride-based transistor device of claim 1, further comprising a second cell field, wherein the power gate runner is located laterally between the first and second cell fields.

6. The enhancement mode Group III nitride-based transistor device of claim 5, wherein the power gate runner is part of a metallic power gate structure that further includes a first additional section that extends transversely to the longitudinal direction and is positioned outboard of the first cell field in the edge region and a second additional section that extends transversely to the longitudinal direction and is positioned outboard of the second cell field in the edge region on an opposing side of the first surface.

7. The enhancement mode Group III nitride-based transistor device of claim 6, wherein the power gate runner, the first additional section and the second additional section are coupled by a further metallic gate runner that extends in the longitudinal direction in the edge region to form the metallic gate power structure.

8. The enhancement mode Group III nitride-based transistor device of claim 1, wherein the isolation ring comprises a recess comprising insulating material, and wherein the recess has a base that is positioned at a depth from the first surface so as to locally interrupt the heterojunction and the two-dimensional carrier gas.

9. The enhancement mode Group III nitride-based transistor device of claim 1, further comprising a second cell field, wherein a gate connection region of the gate runner extends continuously from the first cell field to a second cell field and at least one gate runner is positioned laterally between the first cell field and the second cell field, and wherein a gate contact via extends between the at least one gate runner and an overlying gate power runner.

10. The enhancement mode Group III nitride-based transistor device of claim 1, further comprising a second cell field, wherein a gate connection region of the gate runner extends continuously from the first cell field to a second cell field.

11. The enhancement mode Group III nitride-based transistor device of claim 1, wherein the edge termination structure further comprises a p-doped Group III nitride runner that extends transversely to the longitudinal direction and is located laterally between the isolation ring and a first end of the drain finger.

12. The enhancement mode Group III nitride-based transistor device of claim 11, wherein the p-doped Group III nitride runner is electrically coupled to gate potential or to source potential.

13. The enhancement mode Group III nitride-based transistor device of claim 11, wherein the first end of the drain finger is spaced apart by a distance $L_{DEdge}$ from the p-doped Group III nitride runner and a distance between the drain finger and the gate finger $L_{DG}$, and wherein $L_{DEedge} \geq L_{DG}$.

14. The enhancement mode Group III nitride-based transistor device of claim 11, wherein the p-doped Group III nitride runner further comprises extensions to form a continuous ring that laterally surrounds the first cell field.

15. The enhancement mode Group III nitride-based transistor device of claim 11, wherein the p-doped Group III nitride runner extends from and is integral with the p-doped Group III nitride finger.

16. The enhancement mode Group III nitride-based transistor device of claim 11, wherein the p-doped Group III nitride runner and the p-doped Group III nitride finger together form a continuous ring that laterally surrounds the drain finger.

17. The enhancement mode Group III nitride-based transistor device of claim 11, wherein the p-doped Group III nitride runner is laterally spaced apart from the isolation ring, or an outboard region of the p-doped Group III nitride runner laterally overlaps with the isolation ring.

18. The enhancement mode Group III nitride-based transistor device of claim 11, further comprising a field plate located at a drain side of the metallic gate finger and at a drain side of the p-doped Group III nitride runner.

19. The enhancement mode Group III nitride-based transistor device of claim 18, wherein the field plate is a continuous ring that laterally surrounds and is spaced apart from the drain finger.

20. The enhancement mode Group III nitride-based transistor device of claim 11, further comprising a source connected runner that is arranged laterally between the p-doped Group III nitride runner and the isolation ring.

21. An enhancement mode Group III nitride-based transistor device, comprising:
a body comprising a first surface, the body further comprising a Group III nitride barrier layer arranged on a Group III nitride channel layer and forming a heterojunction therebetween capable of supporting a two-dimensional carrier gas;
a first cell field comprising plurality of transistor cells, each transistor cell comprising a source finger, a gate finger and a drain finger that extend substantially parallel to one another on the first surface and in a longitudinal direction, the gate finger being arranged laterally between the source finger and the drain finger and comprising a p-doped Group III nitride finger arranged between a metallic gate finger and the first surface;
an edge region surrounding the plurality of transistor cells and comprising an edge termination structure;
a gate runner extending transversely to the longitudinal direction and comprising a plurality of separate sections that are laterally spaced apart from one another, wherein each section of the gate runner is coupled to and extends between two gate fingers which are positioned on opposing lateral sides of the drain finger; and a power gate runner above the gate runner and extending transversely to the longitudinal direction, wherein the gate runner is electrically coupled to the power gate runner by at least one gate contact via, wherein the edge termination structure comprises an isolation ring that locally interrupts the two-dimensional carrier gas, wherein each source finger is laterally surrounded by a closed ring of p-doped Group III nitride material, the closed ring being laterally spaced apart from the source finger and from the isolation ring, the closed ring being formed from the two gate fingers positioned on opposing lateral sides of the respective source finger and p-doped Group III nitride gate connection regions that are positioned laterally adjacent and spaced apart from opposing distal ends of the source finger and that extend between the two gate fingers.

* * * * *